United States Patent
Ooishi et al.

(10) Patent No.: US 6,545,926 B2
(45) Date of Patent: Apr. 8, 2003

(54) ANTIFUSE ADDRESS DETECTING CIRCUIT PROGRAMMABLE BY APPLYING A HIGH VOLTAGE AND SEMICONDUCTOR INTEGRATED CIRCUIT DEVICE PROVIDED WITH THE SAME

(75) Inventors: Tsukasa Ooishi, Hyogo (JP); Hiroki Shimano, Hyogo (JP); Hideto Hidaka, Hyogo (JP); Shigeki Tomishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/197,566

(22) Filed: Nov. 23, 1998

(65) Prior Publication Data

US 2002/0075743 A1 Jun. 20, 2002

(30) Foreign Application Priority Data

Jun. 18, 1998 (JP) .......................... 10-171499

(51) Int. Cl.$^7$ ................................. G11C 7/00
(52) U.S. Cl. ................. 365/225.7; 365/96; 365/189.05; 365/149
(58) Field of Search ............... 365/225.7, 96, 365/189.05, 200, 201, 189.07, 51, 149, 102, 177; 257/530, 50

(56) References Cited

U.S. PATENT DOCUMENTS

| | | | |
|---|---|---|---|
| 5,631,862 A | | 5/1997 | Cutter et al. .................. 365/96 |
| 5,706,238 A | * | 1/1998 | Cutter et al. ........... 365/189.05 |
| 5,799,080 A | * | 8/1998 | Padmanabhan et al. ..... 365/103 |
| 5,812,477 A | * | 9/1998 | Casper et al. ............ 365/225.7 |
| 5,838,624 A | * | 11/1998 | Pilling et al. ............ 365/225.7 |
| 5,962,911 A | * | 10/1999 | Manley ....................... 257/50 |

OTHER PUBLICATIONS

Syuso Fujii et al., "A Low–Power Sub 100 ns 256K Bit Dynamic RAM", IEEE Journal of Solid–State Circuits, vol. SC–18, No. 5, Oct. 1983, pp. 441–446.

* cited by examiner

Primary Examiner—David Lam
(74) Attorney, Agent, or Firm—McDermott, Will & Emery

(57) ABSTRACT

An input protective circuit in a semiconductor integrated circuit device includes a bipolar transistor arranged for an interconnection layer. An N-type active region in the bipolar transistor is connected to an electrode of a program element. The electrode is connected to the interconnection layer. The interconnection layer supplies a high voltage for breaking a dielectric of a program element. A voltage on a P-type well is externally adjusted via a resistance element. Thereby, erroneous program due to serge entering at the interconnection layer can be avoided.

25 Claims, 22 Drawing Sheets

ANTIFUSE ADDRESS DETECTING CIRCUIT PROGRAMMABLE BY APPLYING A HIGH VOLTAGE AND SEMICONDUCTOR INTEGRATED CIRCUIT DEVICE PROVIDED WITH THE SAME

BACKGROUND OF THE INVENTION

1. Field of the Invention

The present invention relates to an antifuse address detecting circuit and a semiconductor integrated circuit device, and particularly relates to a structure which uses antifuses and is programmable by applying a high voltage thereto.

2. Description of the Background Art

A semiconductor integrated circuit device provided with memory cells which are arranged in rows and columns to form an array is also provided with a spare row line and a spare column line, which will be also referred to as "redundant lines" hereinafter. Owing to provision of a redundant structure, a defective memory cell or a defective line is repaired by substituting the redundant line for the defective memory cell or line. Provision of the redundant structure improves a rate of acceptable chips on a wafer.

This structure requires an internal circuit, in which a defective address is programmed in advance. In a practical operation, the internal circuit monitors the row and column addresses which are actually input, and can perform substitution of the spare line when it detects that a defective address is input.

For example, Journal of Solid State Circuit Vol. SC-18 (1983), pp. 441–446 (which will be referred to as a "reference 1" hereinafter) has disclosed a fuse-bank address detecting circuit, which is an example of the above internal circuit.

An example of a structure of a conventional fuse-bank address detecting circuit 800 disclosed in the reference 1 will be described below with reference to FIG. 23. The conventional fuse-bank address detecting circuit 800 shown in FIG. 23 includes a plurality of fuses F11, F12, ..., Fm1 and Fm2 as well as a plurality of transistors T11, T12, ..., Tm1, Tm2 and Tx. Fuses F11–Fm2 which are program elements are connected to a common node Z. A fuse corresponding to a defective address is blown in advance. Thereby, the defective address is programmed (stored). A transistor Tx charges and thereby initializes common node Z in response to a precharge signal PR.

Transistors T11–Tm2 are arranged correspondingly to fuses F11–Fm2, respectively. Transistors T11, T12, ..., Tm1 and Tm2 receive address signals a1, /a1, ..., am and /am on their gates, respectively. A signal (inactivating signal fDA) on common node Z changes depending on matching and mismatching between the input address signal and the programmed defective address. A decoder (not shown) receiving this signal selects the redundant line instead of the defective line.

However, the conventional fuse-bank address detecting circuit 800 shown in FIG. 23 requires an expensive laser cutter device for blowing off the fuse. Also, a process load for blowing off the fuse is large, and further a variation occurs in accuracy of blowing.

In contrast to the foregoing, U.S. Pat. No. 5,631,862 (May 20, 1997), which will be referred to as a "reference 2" hereinafter, has disclosed a structure of an antifuse address detecting circuit which does not use a fuse.

An antifuse program circuit 900 which is included in the conventional antifuse address detecting circuit disclosed in the reference 2 will be described below with reference to FIG. 24.

Antifuse program circuit 900 shown in FIG. 24 includes PMOS transistors P8, P9 and P10, NMOS transistors N11, N12, N13, N14 and N16, an inverter circuit 917 and an antifuse 901.

Antifuse 901 has a structure of a capacity type, and usually functions as an open circuit. However, by applying a high voltage thereto and thereby blowing the capacity type structure, it forms a conductive path having a resistance of about several kilohms.

NMOS transistor N16 and antifuse 901 are connected in series between nodes VCON and CGND. Node CGND is set to a level of a ground potential GND in a normal mode, and is supplied with a high voltage of 10 V or more when antifuse 901 is blown (i.e., in an address program mode).

NMOS transistor N16 operates such that a voltage higher than a breakdown voltage of a gate oxide film may not be applied across the sources and gates, or drains and gates of NMOS transistors N11, N12 and N13 when a high voltage of 10 V or more is applied to node CGND.

NMOS transistors N12, N13 and N14 are connected in series between the ground potentials. NMOS transistor N12 receives on its gate electrode a reset signal RST. Reset signal RST is active and at H-level when it is initially set. NMOS transistor N13 receives on its gate electrode an address signal ADDR.

NMOS transistor N14 receives on its gate electrode a signal FR which is an output of inverter circuit 917 (i.e., an output of this circuit). Signal FR is an input signal of an address comparing circuit (not shown), which is formed of an NOR logic gate or an NAND logic gate, and performs comparison of address signal ADDR. NMOS transistor N14 may be turned off with signal FR to interrupt a path of current, which tends to flow toward the ground potential via nodes VCOM and NMOS transistors N13 and N14 when blowing antifuse 901.

PMOS transistors P8 and P9 are connected between an internal power supply potential VCC and a node W. PMOS transistor P8 receives on its gate electrode a signal T(RAS). PMOS transistor P9 receives signal FR on its gate electrode.

PMOS transistor P10 and NMOS transistor N11 are connected in series between nodes W and VCOM. NMOS transistor N11 receives a signal DVCE on its gate electrode. Signal DVCE is an enable signal of this circuit, and its level is raised to half the internal power supply voltage (Vcc/2) when blowing antifuse 901 or detecting the address. PMOS transistor P10 has a channel length and a channel width which are determined to provide a channel resistance of about 300 KΩ, and is always on.

NMOS transistor N11 has a channel length and a channel width which are determined to provide a current drive power exceeding that of PMOS transistor P10. Inverter circuit 917 is connected to a connection node between PMOS and NMOS transistors P10 and N11.

In the foregoing circuit, in which programming is performed with the antifuse not requiring laser for blowing, steps for laser blowing can be reduced. Also, an expensive device for blowing is not required.

However, the structure using the antifuse as a program element suffers from such a problem (erroneous programming) that serge (noises) entering an interconnection for voltage application blows an antifuse not requiring programming.

Further, an excessive current flows when the antifuse is blown, and it is necessary to suppress an influence exerted on peripheral elements by the excessive current.

If the antifuse is used as the program element, the antifuse for a defective address must be reliably blown. Even if the blowing is insufficient, a normal operation must be ensured. Further, it is necessary to verify an operation of the antifuse address detecting circuit, and it is also necessary to remove an initial failure in the program elements.

If the above structure is applied to a semiconductor integrated circuit device, it is necessary to reduce the number of circuit elements and therefore a layout area.

SUMMARY OF THE INVENTION

An object of the invention is to provide an antifuse address detecting circuit, overcoming the above problems, which uses an antifuse as a program element, and can suppress an influence, which may be exerted on its peripheral elements by blowing the same.

Another object of the invention is to provide an antifuse address detecting circuit, which uses an antifuse as a program element, and can stably and reliably blow the antifuse.

Still another object of the invention is to provide a semiconductor integrated circuit device, in which an antifuse address detecting circuit programmable by applying a high voltage is used as a redundancy determining circuit, and particularly a semiconductor integrated circuit device which can suppress an influence exerted by the high voltage on a peripheral circuit, and requires a small layout area.

Yet another object of the invention is to provide a semiconductor integrated circuit device, in which an antifuse address detecting circuit programmable by applying a high voltage is used as a redundancy determining circuit, and particularly a semiconductor integrated circuit device which can reliably perform redundancy determination.

An antifuse address detecting circuit according to the invention includes an antifuse having a capacity type structure, and changing into a low-resistance element when the capacity type structure is blown by application of a high voltage; a first node connected to one of terminals of the antifuse; a second node connected to the other terminal of the antifuse; a first supply circuit for supplying the high voltage required for blowing the antifuse to the first node in a program mode for blowing the antifuse; a second supply circuit for supplying a voltage to the second node; and a control circuit for controlling supply of the voltage from the first supply circuit to the first node in response to the voltage on the second node.

Accordingly, a major advantage of the invention is that programming can be performed easily with a high voltage. Also, an influence which may be exerted on a peripheral element by a high voltage can be prevented by controlling supply of the high voltage required for blowing the antifuse in accordance with a state of blowing.

In particular, supply of the high voltage applied to one of the nodes of the antifuse can be controlled in accordance with the voltage on the other node of the antifuse.

Particularly, the state of blowing of the antifuse can be tested in the program mode.

Particularly, an initial failure of the antifuse can be tested.

A semiconductor integrated circuit device according to the invention includes a plurality of memory cells; a plurality of redundant cells to be used as substitutes for defective memory cells among the plurality of memory cells; and a plurality of antifuse address detecting circuits programmable with program addresses corresponding to the defective memory cells in a program mode, and issuing a result of determination, in a read mode, by determining whether the redundant cell is used or not in response to an applied comparison address. Each of the plurality of antifuse address detecting circuits has an antifuse having a capacity type structure and being changed into a low resistance element when the capacity type structure is blown by application of a high voltage, a first node connected to one of terminals of the antifuse, a second node connected to the other terminal of the antifuse, a first supply circuit for applying the high voltage required for blowing the antifuse to the first node in the program mode, a second supply circuit for supplying a voltage to the second node, a control circuit for controlling supply of the voltage from the first supply circuit to the first node in response to the voltage on the second node, a common node for outputting the result of the determination, and a detecting circuit for determining a state of blowing of the corresponding antifuse in response to the corresponding comparison address, and charging/discharging the common node based on a result of the determination in the read mode. The semiconductor integrated circuit device further includes a select circuit being responsive to respective signals on the common nodes to select the corresponding memory cells or the corresponding redundant cells.

Accordingly, the invention further provides the following advantages. Since the program element (antifuse) which does not require blowing of a fuse with laser is used in the redundancy determining circuit, the programming steps can be reduced in number. Since the supply of the high voltage required for blowing the antifuse is controlled in accordance with the state of blowing, it is possible to prevent an influence of the high voltage on the peripheral element.

Particularly, the state of blowing of the antifuse can be tested in the program mode.

Particularly, an initial failure of the antifuse can be tested. Also, in accordance with the result of the initial failure, it is possible to disable the corresponding antifuse address detecting circuit.

Further, a bipolar transistor may be arranged in a high voltage applied region of the antifuse, whereby it is possible to prevent erroneous programming, which may be caused by serge applied during a non-programming period. A shield layer may be arranged for the antifuse, whereby an influence on peripheral elements can be prevented.

An antifuse address detecting circuit according to the invention includes a program circuit to be programmed by applying a high voltage in response to an applied program address and determining the programmed state based on an applied comparison address to output a result of the determination; and a shield layer for shielding an antifuse.

Accordingly, the invention can further provide the following advantage. Since the shield layer is provided for the antifuse which is programmed by applying the high voltage applied thereto, an influence by blowing on peripheral elements can be suppressed, and a normal operation can be ensured.

Particularly, a bipolar transistor may be arranged in a high voltage applied region of the antifuse programmable with the high voltage applied thereto, whereby erroneous programming due to serge can be prevented. A voltage on a gate region of the bipolar transistor may be externally adjusted, whereby it is possible to control a path of a current in a region of the antifuse externally supplied with the high voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

An input protective circuit in an embodiment 1 of the invention will now be described below. The input protective circuit of the embodiment 1 of the invention is arranged for a circuit using a high voltage and, for example, for an antifuse which is programmable with a high voltage applied thereto.

Figure 1:
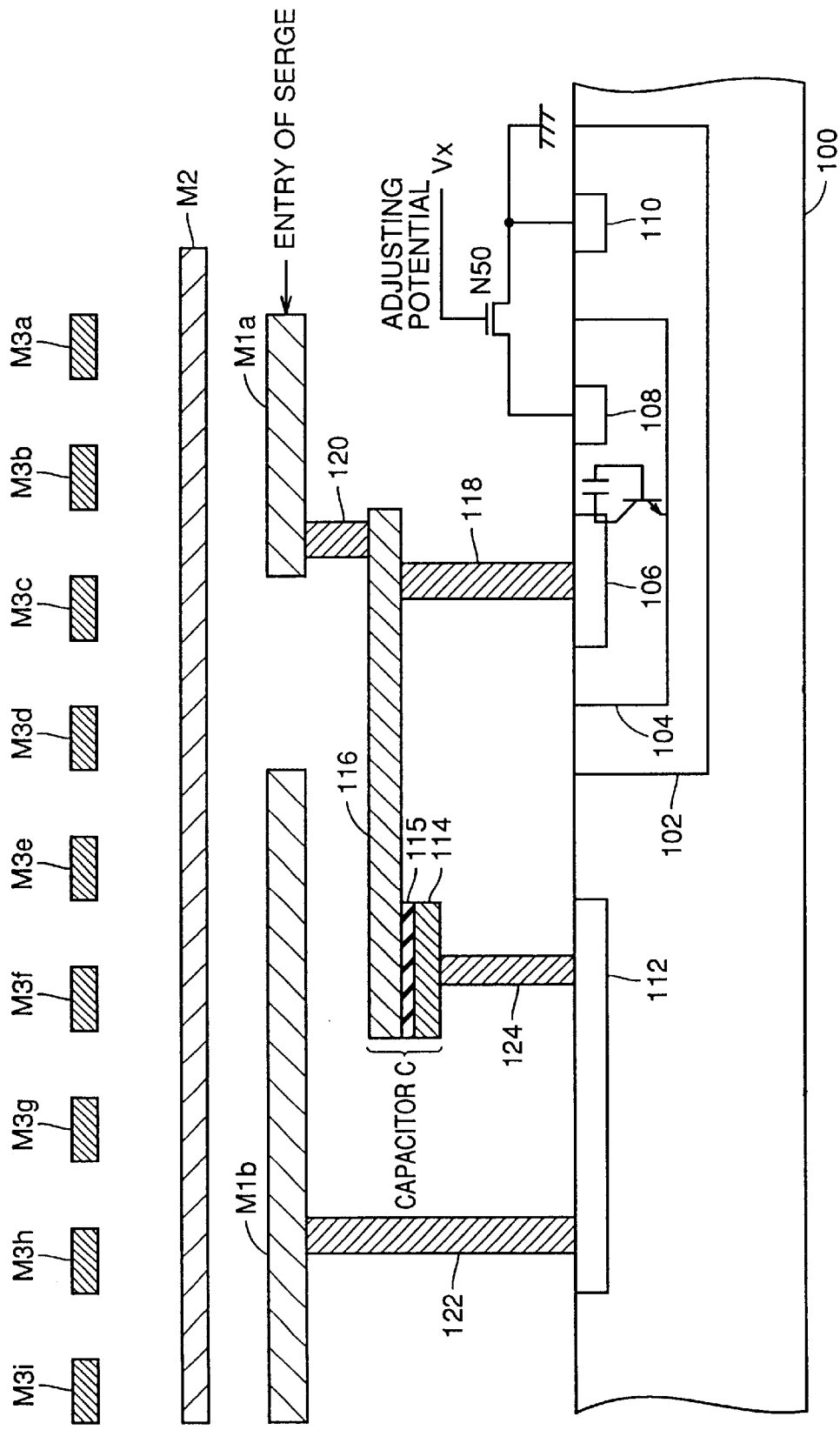
FIG. 1 is a cross section showing a structure of an input protective circuit in an embodiment 1 of the invention.
Figure 2:
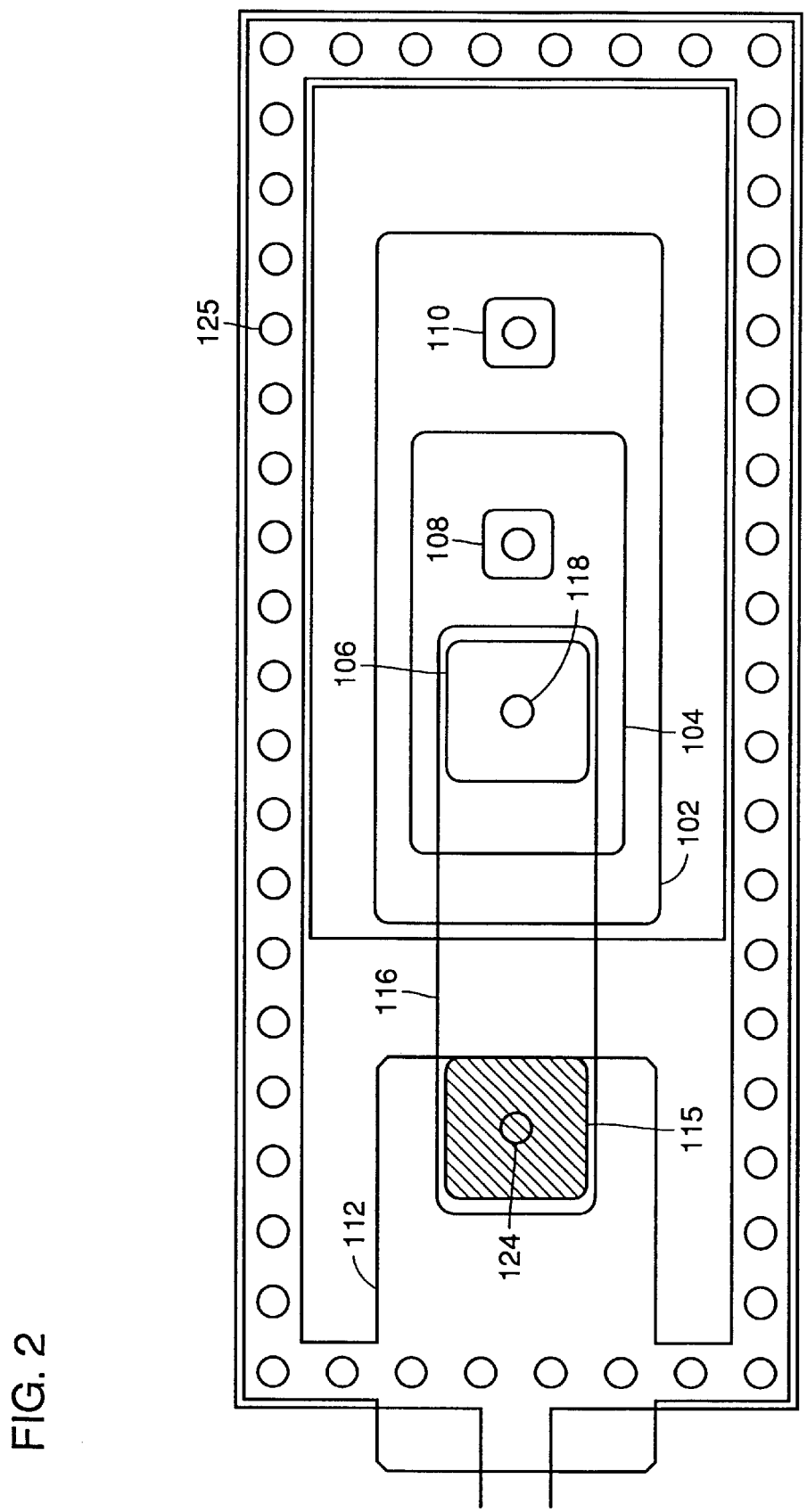
FIG. 2 is a plan showing a structure of the input protective circuit in the embodiment 1 of the invention shown in FIG. 1.

Referring to FIGS. 1 and 2, description will now be given on a structure, in which the input protective circuit of the embodiment 1 of the invention is applied to a semiconductor integrated circuit device. In FIGS. 1 and 2, a character "C" represents a capacitor (antifuse) functioning as a program element. In FIG. 2, a reference number "125" represents a guard ring.

Referring to FIGS. 1 and 2, an N-type well 102 and an N-type active region 112 are formed at a P-type substrate 100 (semiconductor substrate) with a predetermined space between each other. A P-type well 104 and an N-type active region 110 are formed at N-type well 102 with a predetermined space between each other. An N-type active region 106 and a P-type active region 108 are formed at P-type well 104 with a predetermined spaced between each other. N-type active region 106, P-type well 104 and N-type well 102 form a parasitic bipolar.

Capacitor C is formed of electrodes 114 and 116 and a dielectric 115. One of electrodes (i.e., electrode 116) of capacitor C is connected to a metal interconnection M1a at a first layer through a contact hole 120. The other electrode 114 of capacitor C is connected to N-type active region 112 through a contact hole 124. N-type active region 112 is connected to a metal interconnection M1b at the first layer through a contact hole 122.

For effecting programming on capacitor C (i.e., for blowing an antifuse), a high voltage is externally applied to metal interconnection M1a at the first layer. The applied high voltage breaks dielectric 115. When dielectric 115 is broken, a quantity of current flowing through capacitor C changes. In an internal circuit (not shown) connected to metal interconnection M1b at the first layer detects the change in quantity of current flowing through capacitor C. If capacitor C described above is used, for example, in a redundancy determining circuit, a defective address is detected based on change in quantity of the current.

N-type active region 106 is connected to electrode 116 of capacitor C through a contact hole 118. A resistance element is arranged in P-type active region 108. According to the embodiment 1 of the invention, an NMOS transistor N50 (resistance element) is connected between P-type active region 108 and a ground potential. An adjusting potential Vx is applied to a gate electrode of NMOS transistor N50. N-type active region 110 is connected to a ground potential GND.

The potential on P-type active region 108 is adjusted in accordance with adjusting potential Vx applied to the gate electrode of NMOS transistor N50. A degree of coupling (i.e., resistance value) between N-type active region 106 and P-type well 104 changes. As a result, a magnitude of the current flowing from N-type active region 106 toward N-type well 102 changes.

When breaking capacitor C (i.e., when executing the programming), P-type well 104 is set to ground potential GND. In the case other than the breaking (i.e., during non-programming), the potential on P-type well 104 is adjusted.

During non-programming, serge (noise) may enter metal interconnection M1*a*, in which case the potential on N-type active region 106 rises. Thereby, the capacity coupling between N-type active region 106 and P-type well 104 raises the potential on the P-type well. P-type well 104 has an impedance with respect to true ground potential GND. Therefore, the raised potential on P-type well 104 does not immediately converge.

Accordingly, a forward potential difference occurs between P-type well 104 and N-type well 102. As a result, the parasitic bipolar transistor (N-type active region 100, P-type well 104 and N-type well 102) is turned on, and the serge on metal interconnection M1*a* escapes into N-type well 102.

In the prior art, if the serge enters metal interconnection M1*a* during non-programming, it breaks a capacitor which is not to be programmed, resulting in an erroneous program. According to the embodiment 1 of the invention, however, the foregoing structure can prevent unnecessary application of a high voltage to capacitor C.

Metal interconnection M1*b* covering dielectric 115 of capacitor C is arranged above electrode 116. Metal interconnection M1*b* is connected to, e.g., ground potential GND. Metal interconnection M1*b* is used for shielding capacitor C.

Even if breakage of dielectric 115 is caused and thereby affects the insulating film around the same, the shield provided by metal interconnection M1*b* can prevent an influence on the other element portion.

Accordingly, such an arrangement is allowed that a metal interconnection M2 is arranged at a second layer above metal interconnections M1*a* and M1*b* with an oxide film therebetween, and metal interconnections M3*a*, M3*b*, . . . , M3*i* are arranged at a third layer above metal interconnection M2 with an insulating film therebetween. Metal interconnection M2 and others at higher layers are fixed at potentials on portions connected thereto through leakage paths, respectively, so that their operations are not affected.

Accordingly, a region above capacitor C can be utilized for forming the metal interconnections and elements at multiple layers. In the embodiment 1 of the invention, metal interconnection M1*b* is used as the shield for capacitor C. However, another interconnection layer of, e.g., polycrystalline silicon may be used. The peripheries of the elements are shielded by the N-type active region.

A structure of an MOS transistor in the embodiment 1 of the invention will be described below with reference to FIGS. 3 and 4. For reference, a structure of an MOS transistor used in a conventional circuit is shown in FIG. 5. The circuit including a program element which is programmable with a high voltage requires a transistor structure having a high breakdown voltage.

Figure 3:
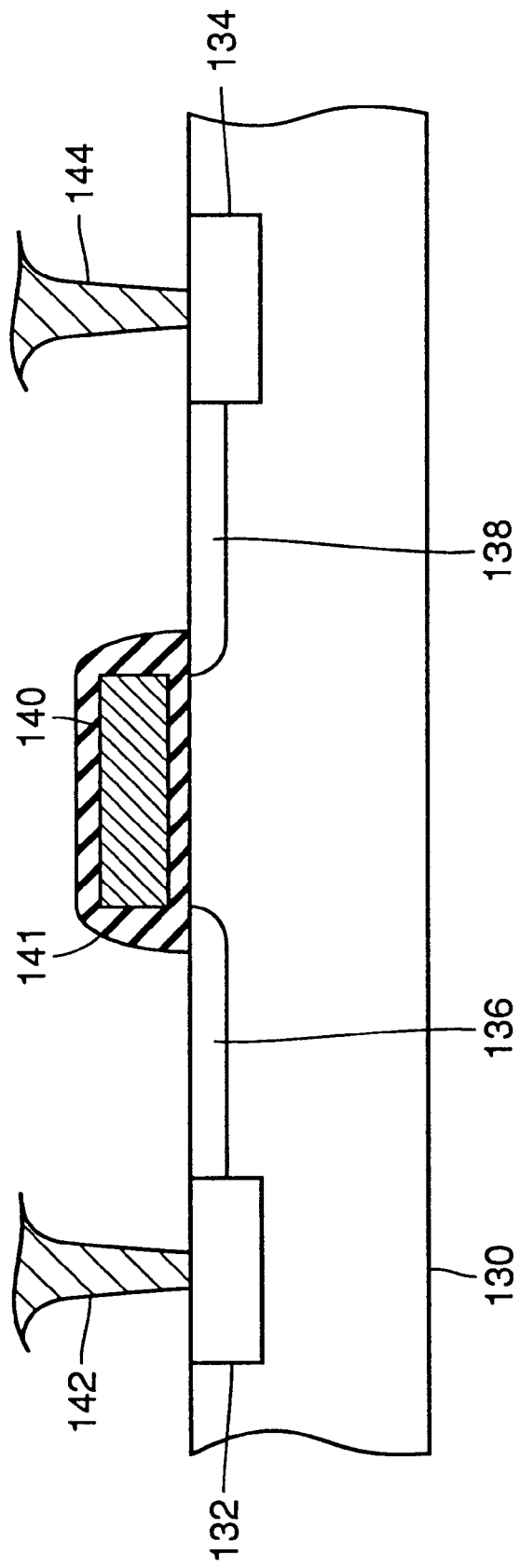
FIG. 3 is a cross section showing a structure of an MOS transistor in the embodiment 1 of the invention.
Figure 4:
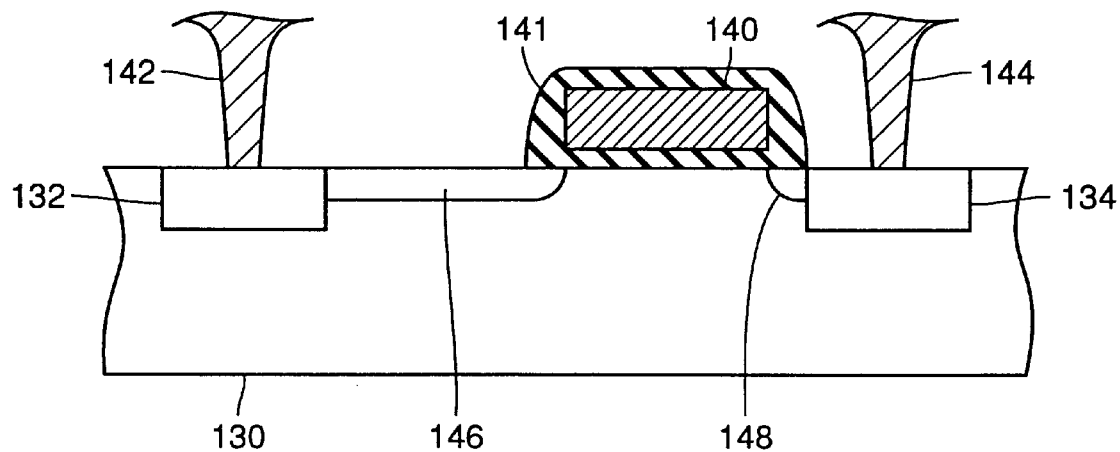
FIG. 4 is a cross section showing a structure of the MOS transistor in the embodiment 1 of the invention.
Figure 5:
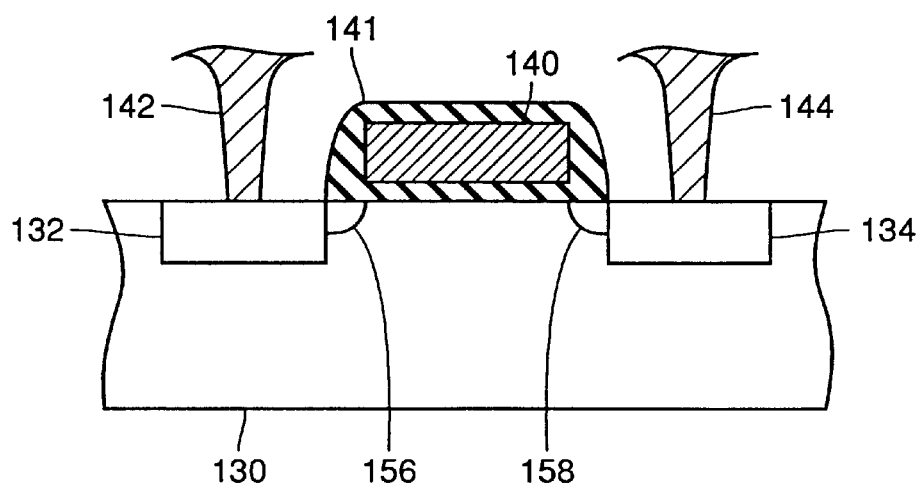
FIG. 5 is a cross section showing a structure of a conventional MOS transistor.

MOS transistors shown in FIGS. 3 to 5 have LDD (Lightly Doped Drain) structures. Heavily doped source/drain regions 132 and 134 are formed at a main surface of a well 130 with a predetermined space between each other. Heavily doped source/drain regions 132 and 134 are connected to interconnections (not shown) through contact holes 142 and 144, respectively.

For heavily doped source/drain regions 132 and 134, there are arranged lightly doped regions, which are indicated by 136 and 138 in FIG. 3, 146 and 148 in FIG. 4, and 156 and 158 in FIG. 5. A gate electrode 140 is formed on a region between the lightly doped regions.

Lightly doped regions 136 and 138, or 146 and 148 connect the channel region, which is produced under gate electrode 140, to source/drain regions 132 and 134, respectively. Lightly doped regions 136 and 138 as well as 146 and 148 are produced after forming gate electrode 140 by implanting impurity using gate electrode 140 as a mask.

In the structure shown in FIG. 3, both lightly doped regions 136 and 138 are wide, and both source/drain regions 132 and 134 are situated at positions remote from the gate edge. In the structure shown in FIG. 4, lightly doped region 146 is wide, and source/drain region 132 is remote from the gate edge. In the conventional structure shown in FIG. 5, both lightly doped regions 156 and 158 are narrow, and both source/drain regions 132 and 134 are located near the gate edge.

In the conventional structure, application of a high voltage raises the potential on the silicon surface, and therefore may break the transistor. Further, electrons which entered gate insulating film 141 through the silicon surface may reach gate electrode 140 so that they may be monitored as a gate current. This kind of gate electrode may cause an unexpected operation.

In the transistor of the embodiment 1 of the invention, the heavily doped region (source/drain region 132 or 134) is not present near the gate edge so that the transistor can have an improved breakdown voltage. Therefore, by using the MOS transistor shown in FIG. 3 and 4, it is possible to avoid breakage of the element when a high voltage is applied for breaking the antifuse.

Embodiment 2

Figure 6:
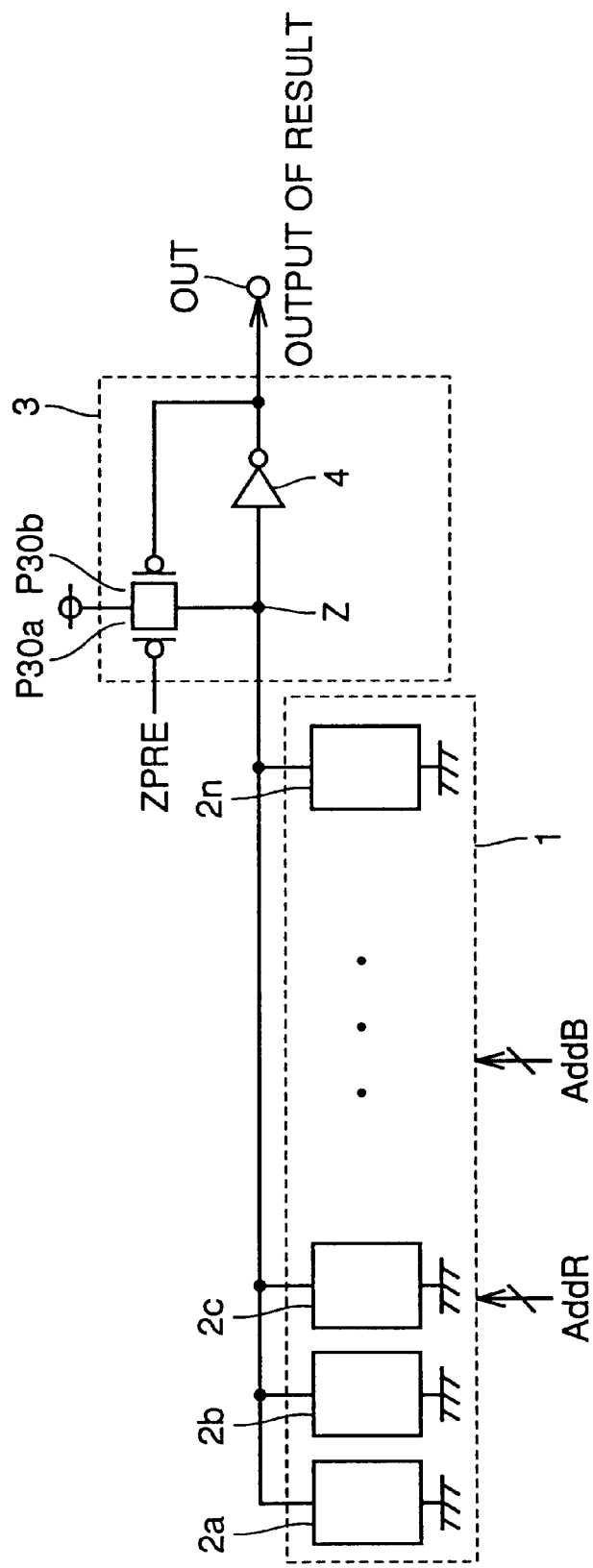
FIG. 6 shows a structure of a program circuit 10 in an embodiment 2 of the invention.

A program circuit 10 in an embodiment 2 of the invention will be described below with reference to FIG. 6. Program circuit 10 shown in FIG. 6 is used in a redundancy determining circuit of a semiconductor memory device. Program circuit 10 includes a program unit 1 and a holding circuit 3.

Program unit 1 includes a plurality of antifuse address detecting circuits 2*a*, 2*b*, 2*c*, . . . , 2*n*. Program unit 1 receives on its inputs a program address AddB forming a program target and a comparison address AddR.

Each of antifuse address detecting circuits 2*a*, 2*b*, . . . stores and, in other words, is programmed with corresponding program addresses. Each of antifuse address detecting circuits 2*a*, 2*b*, . . . is connected between the ground potential and common node Z.

The potential on common node Z changes depending on the state of programming of the antifuse address detecting circuit and comparison address AddR. The state of common node Z is observed on an output node OUT.

Holding circuit 3 is arranged between common node Z and output node OUT. Holding circuit 3 is used for maintaining a constant potential on common node Z. Holding circuit 3 includes PMOS transistors P30*a* and P30*b* as well as inverter circuit 4.

Each of PMOS transistors P30*a* and P30*b* is connected between the power supply potential and common node Z. Inverter circuit 4 is arranged between common node Z and output node OUT. Inverter circuit 4 inverts and outputs the signal received from common node Z.

PMOS transistor P30a receives on its gate electrode a precharge signal ZPRE. PMOS transistor P30b receives on its gate electrode the output of inverter circuit 4.

For initial setting, precharge signal ZPRE at L-level is applied so that common node Z attains H-level. Then, precharge signal ZPRE is set to H-level. Thereafter, PMOS transistor P30b will be turned off when the potential on common node Z attains L-level. In response to the above setting to H-level, the potential level dn common node Z attains L-level. Also, the potential on output node OUT attains H-level.

The structure of antifuse address detecting circuit 2a in the embodiment 2 of the invention shown in FIG. 6 will be described below with reference to FIG. 7. Other antifuse address detecting circuits 2b, 2c, . . . shown in FIG. 6 have the same structures as that shown in FIG. 7.

Figure 7:
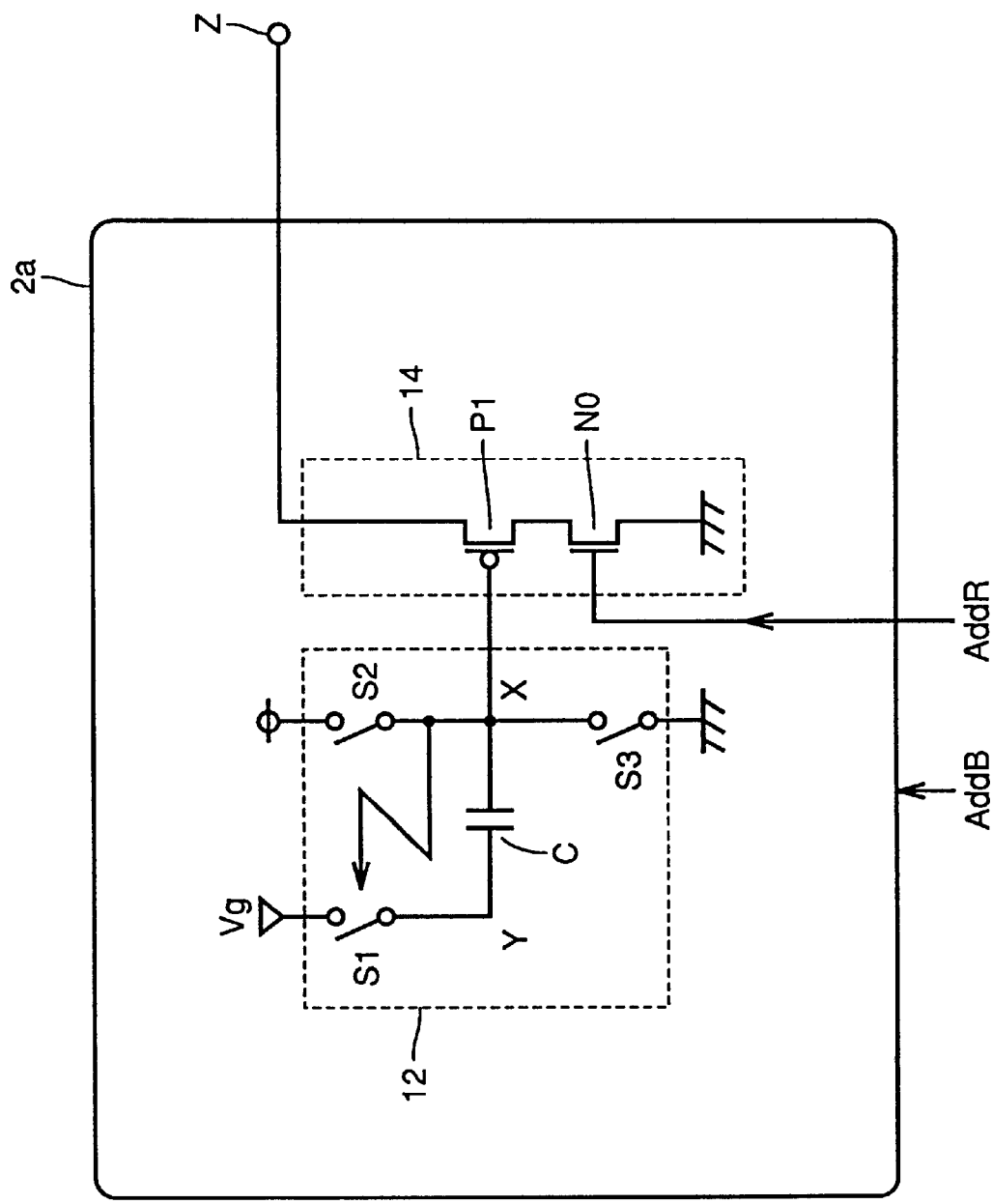
FIG. 7 shows an example of a structure of an antifuse address detecting circuit 2a in the embodiment 2 of the invention shown in FIG. 6.

Antifuse address detecting circuit 2a shown in FIG. 7 includes an antifuse program circuit 12 and an address comparing circuit 14. Antifuse program circuit 12 will now be described below. Antifuse program circuit 12 includes switches S1, S2 and S3 as well as capacitor C (antifuse) which is a program element. Switches S2 and S3 are connected in series between the power supply potential and the ground potential. Capacitor C is arranged between a node X, which is a connection node between switches S2 and S3, and a node Y which will be described later.

Switch S1 is arranged between node Y and a program power supply potential Vg. Switch S1 is turned on/off in response to the potential on node X. Switch S3 is turned on in response to program address AddR.

In the address program mode for breaking the dielectric of capacitor C (blowing the antifuse), node Y is supplied with a high voltage required for breaking the dielectric of capacitor C. By breaking the dielectric of capacitor C, a quantity of current flowing through node X changes. In the normal mode, the potential on node Y is equal to internal power supply potential VCC.

Address comparing circuit 14 will now be described below. Address comparing circuit 14 is connected between common node Z and the ground potential. Address comparing circuit 14 changes the potential on common node Z in response to the potential on node X and comparison address AddR.

Address comparing circuit 14 includes PMOS transistor P1 and NMOS transistor N0. PMOS transistor P1 and NMOS transistor N0 are connected in series between common node Z and the ground potential. The gate electrode of PMOS transistor P1 is connected to node X. NMOS transistor N0 receives comparison address AddR on its gate electrode.

When PMOS transistor P1 and NMOS transistor N0 are turned on, common node Z is discharged to carry ground potential GND.

Control and operation of program circuit 10 in the embodiment 2 of the invention will be described below.

First, control and operation of program circuit 10 in the address program mode will be described below. In the address program mode, capacitor C included in the antifuse address detecting circuit to be programmed is broken in response to corresponding program address AddB.

Common node Z is charged (set to H-level) by applying a precharge signal ZPRE at L-level. Switch S2 is turned on. Node X carries internal power supply potential VCC. Program power supply potential Vg is set to a high voltage VPP required for breaking the dielectric of capacitor C.

For capacitor C, to be programmed (in other words, in response to program address AddB), switch S3 is turned on. Node X is reset (i.e., set to the ground potential). Thereby, switch S1 is turned on. The potential on node Y rises to the level of high voltage VPP. Since the high voltage is applied across the opposite ends of capacitor C, the dielectric breaks. Thereby, the programming is finished (completed).

After the dielectric of capacitor C is broken to an extent allowing flow of an appropriate amount of current, the potential on node X is fed back. Thereby, switch S1 is turned off to stop supply of the high voltage.

Owing to the above structure, it is possible to prevent application of the high voltage to the element other than capacitor C to be programmed (e.g., the capacitor in a neighboring antifuse address detecting circuit). Consequently, it is possible to avoid breakage of the peripheral element due to unnecessary application of the voltage.

Then, control and operation of the program circuit 10 in the read mode will be described below. In the read mode, the operation is performed to determine match/mismatch between the supplied comparison address and the program address used for programming.

Common node Z is charged (set to H-level) by applying precharge signal ZPRE at L-level. Switch S2 is turned on. Node X carries internal power supply voltage VCC. Program power supply potential Vg is set to an internal power supply voltage VCC.

Switch S3 is turned on. The state of node X is reset to carry the ground potential. Thereby, switch S1 is turned on. Node Y carries internal power supply voltage VCC.

When the dielectric of capacitor C is broken (i.e., in the programmed state), node X carries internal power supply voltage VCC. Therefore, PMOS transistor P1 attains the cutoff state. Independently of comparison address AddR, common node Z maintains H-level.

When the dielectric of capacitor C is not broken (i.e., in the unprogrammed state), node X carries ground potential GND. Therefore, PMOS transistor P1 is turned on. By applying corresponding comparison address AddR, NMOS transistor N0 is turned on. Consequently, common node Z is discharged to attain L-level.

By monitoring the result through output node OUT, it can be determined whether the program address used in the program matches with the comparison address.

Figure 8:
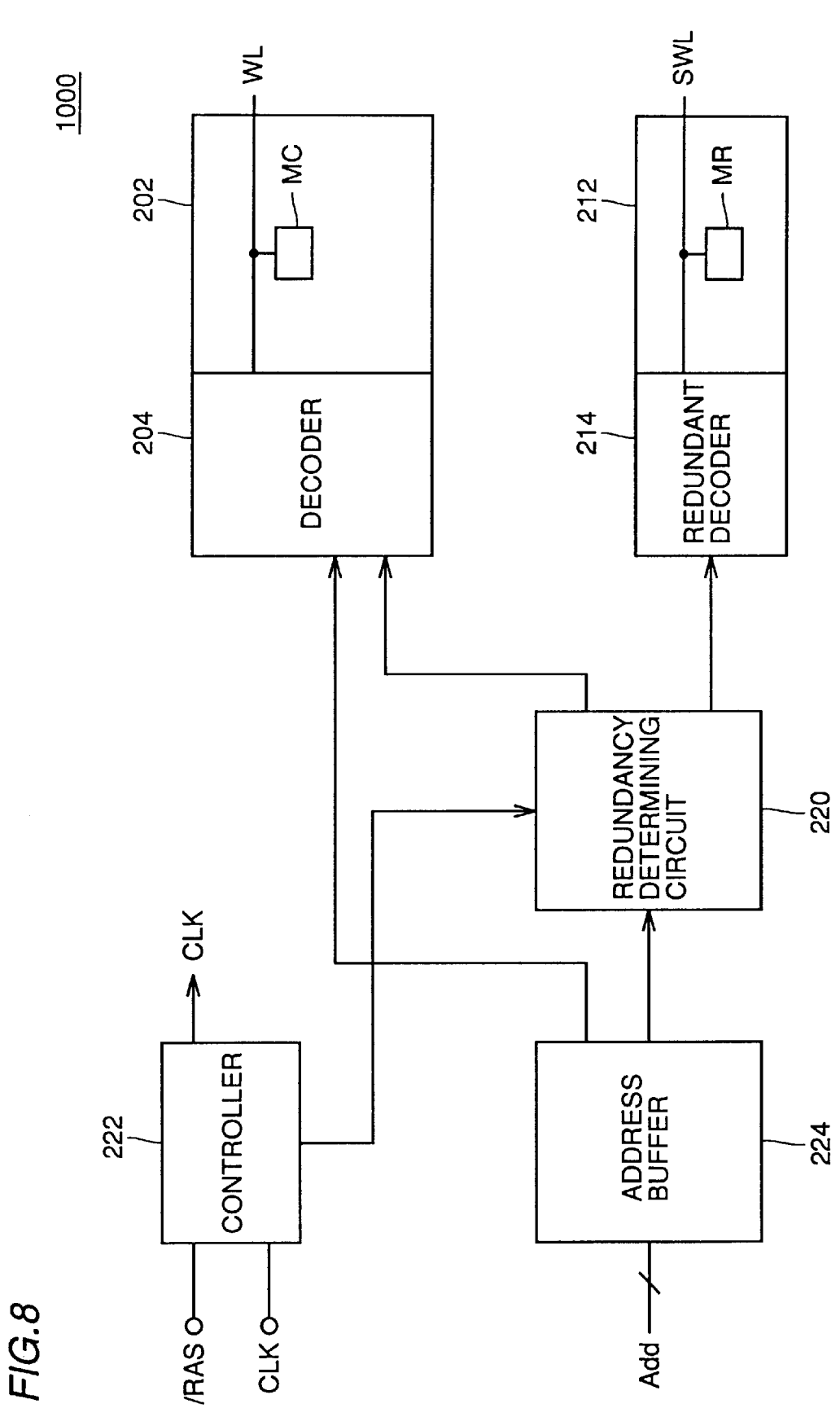
FIG. 8 is a schematic block diagram showing an example of a structure, in which the program circuit 10 in the embodiment 2 of the invention shown in FIG. 6 is applied to a semiconductor memory device 1000.

Referring to FIG. 8, description will now be given on a structure in which program circuit 10 of the embodiment 2 of the invention shown in FIG. 6 is applied to a semiconductor integrated circuit device.

A semiconductor integrated circuit device 1000 shown in FIG. 8 includes a memory cell array 202, a decoder 204, a redundant cell array 212, a redundant decoder 214, a redundancy determining circuit 220, a controller 222 and an address buffer 224.

Memory cell array 202 includes a plurality of memory cells MC. Redundant cell array 112 includes a plurality of redundant cells MR. Redundant cells MR are used as substitutes for defective memory cells in memory cell array 202.

Controller 222 receives external signals such as an external row address strobe signal /RAS and an external clock signal CLK on their inputs, and issues an internal clock signal controlling an internal operation and operation mode designating signals (i.e., a signal for designating the address program mode and signals required for controlling other operations). Address buffer 224 receives external address signal Add on its input.

The program circuit 10 shown in FIG. 6 is arranged in redundancy determining circuit 220. When a defective memory cell is found in the initial stage of development, the corresponding defective address is stored (programmed) in program circuit 10.

In the read mode after the above, the address of the memory cell forming the read target (i.e., comparison address) is applied so that, based on the result of the redundancy determination (i.e., change in potential on output node OUT), redundant cell MR included in redundant cell array 212 is selected instead of defective memory cell MC included in memory cell array 202.

In accordance with the output of address buffer 224 and the result of redundancy determination by redundancy determining circuit 220, decoder 204 activates a word line WL connected to the corresponding memory cell included in memory cell array 202.

In response to the result of determination of redundancy determining circuit 220, redundancy decoder 214 activates a spare word line SWL connected to the corresponding redundant cell.

Owing to the above structure, blowing of fuse with laser is not performed in the initial stage of development of the semiconductor integrated circuit device, and the intended address can be programmed highly reliably (elimination of fuse blowing step).

Figure 24:
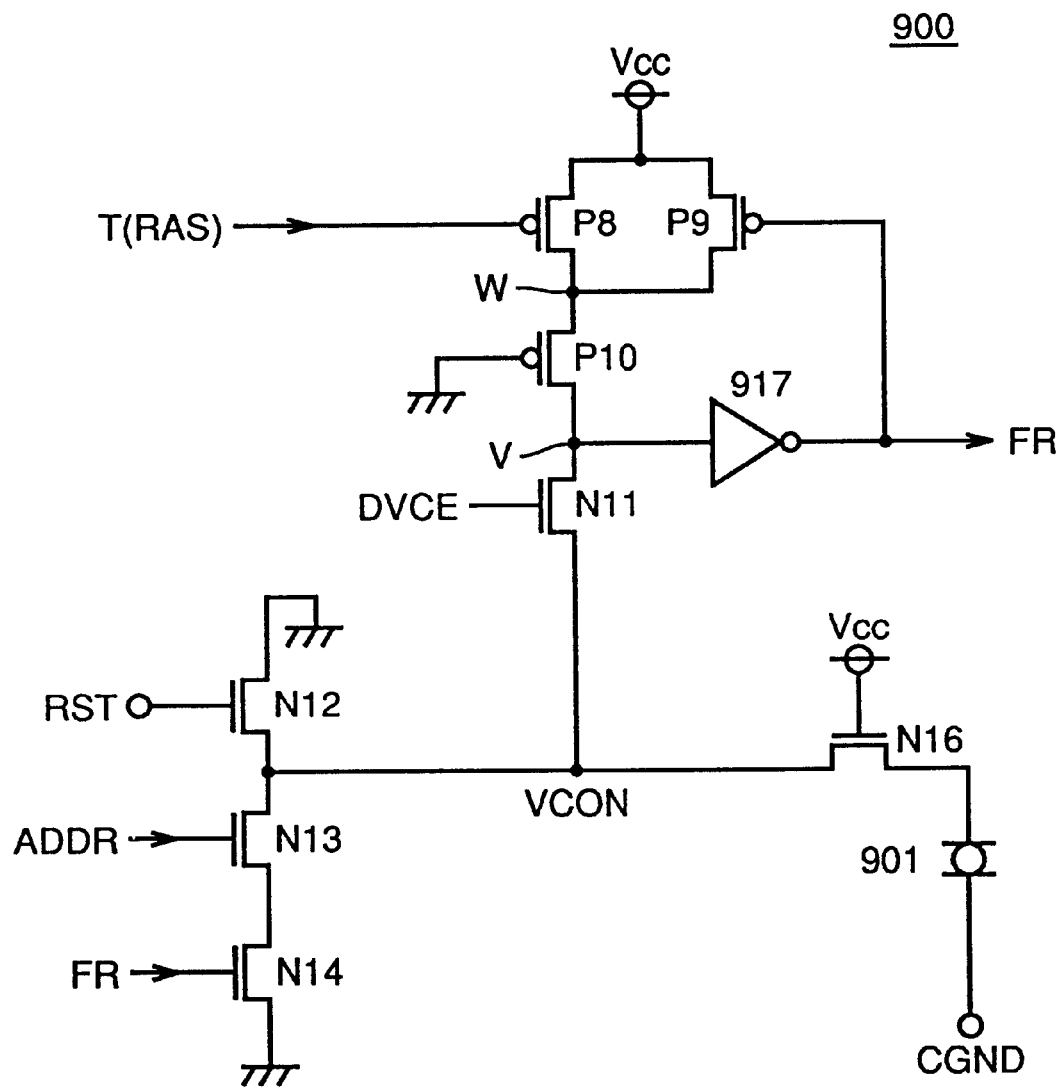
FIG. 24 is a circuit diagram showing an example of a structure of a conventional antifuse program circuit 900 disclosed in the reference 2.

Compared with the conventional structure shown in FIG. 24, the antifuse address detecting circuits shown in FIGS. 6 and 7 require a small number of elements. Therefore, a whole layout area of the semiconductor integrated circuit device can be reduced.

The high voltage is used for breaking the dielectric of the capacitor. However, supply of the high voltage is stopped when the dielectric of the capacitor is broken to a certain extent. Thereby, an influence on the peripheral elements can be suppressed.

As already described in connection with the embodiment 1, the embodiment 2 may likewise be provided with an input protective circuit for the antifuses, whereby an influence on the peripheral circuit can be prevented, and the erroneous programming due to serge can be prevented. Also, an interconnection layer can be arranged on the antifuse.

Embodiment 3

A structure of a program circuit 20 in an embodiment 3 of the invention will be described below with reference to FIG. 9.

Figure 9:
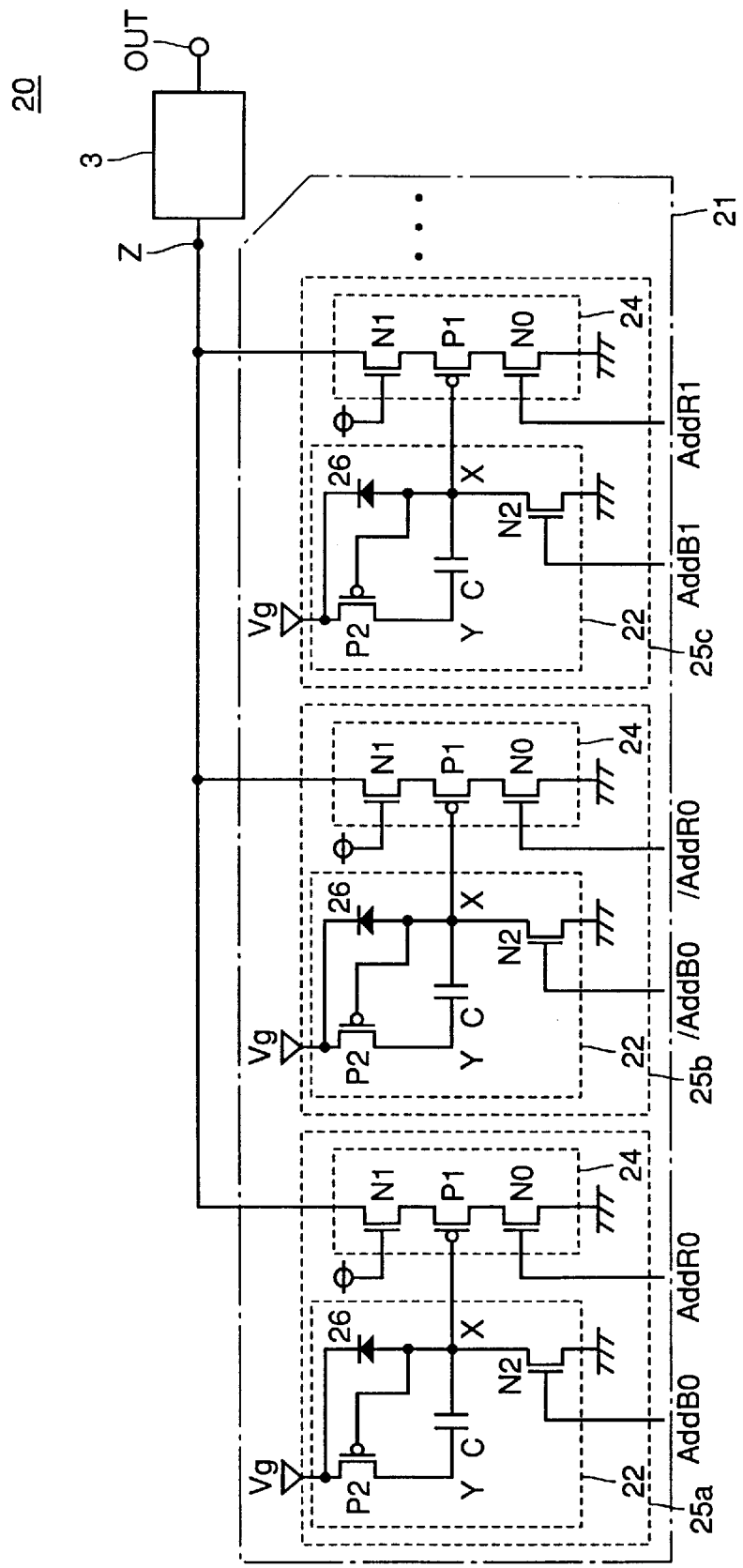
FIG. 9 shows an example of a specific structure of a major portion of a program circuitry 20 in an embodiment 3 of the invention.

Program circuit 20 shown in FIG. 9 is used instead of program circuit 10 of the embodiment 1. The same components as those shown in FIGS. 6 and 7 bear the same reference numbers or characters, and will not be described below. Program circuit 20 includes a program unit 21 and holding circuit 3.

Program unit 21 includes a plurality of antifuse address detecting circuits 25a, 25b, 25c, . . . . Each of antifuse address detecting circuits 25a, 25b, 25c, . . . is connected between the ground potential and common node Z.

As a typical example, a structure of antifuse address detecting circuit 25a will be described below with reference to FIG. 9. Antifuse address detecting circuit 25a shown in FIG. 9 includes an antifuse program circuit 22 and an address comparing circuit 24.

Antifuse program circuit 22 has the following structure. Antifuse program circuit 22 includes a PMOS transistor P2, an NMOS transistor N2, a capacitor C (antifuse) which is a program element, and a diode 26. PMOS transistor P2 and diode 26 serve as switches S1 and S2 shown in FIG. 6, respectively. NMOS transistor N2 serves as switch S3 shown in FIG. 6.

NMOS transistor N2 is connected between node X and the ground potential. NMOS transistor N2 receives a corresponding program address AddB0 on its gate electrode.

Diode 26 is connected between program power supply potential Vg and node X. PMOS transistor P2 is connected between program power supply potential Vg and node Y. The gate electrode of PMOS transistor P2 is connected to node X. Capacitor C is arranged between nodes Y and X.

Address comparing circuit 24 will be described below. Address comparing circuit 24 includes NMOS transistors N0 and N1 as well as PMOS transistor P1. NMOS transistor N1, PMOS transistor P1 and NMOS transistor N0 are connected in series between common node Z and the ground potential.

NMOS transistor N1 is provided for relieving an electric field. The gate electrode of NMOS transistor N1 is connected to the power supply potential.

The gate electrode of PMOS transistor P1 is connected to node X. NMOS transistor N0 receives a corresponding comparison address AddR0 on its gate electrode.

In the initially set state, common node Z carries a precharged potential. In the address program mode, a high voltage required for breaking the dielectric of capacitor C is applied to node Y through PMOS transistor P2.

Control and operation of program circuit 20 of the embodiment 3 of the invention shown in FIG. 9 will be described below with reference to timing charts of FIGS. 10 and 11.

Figure 10:
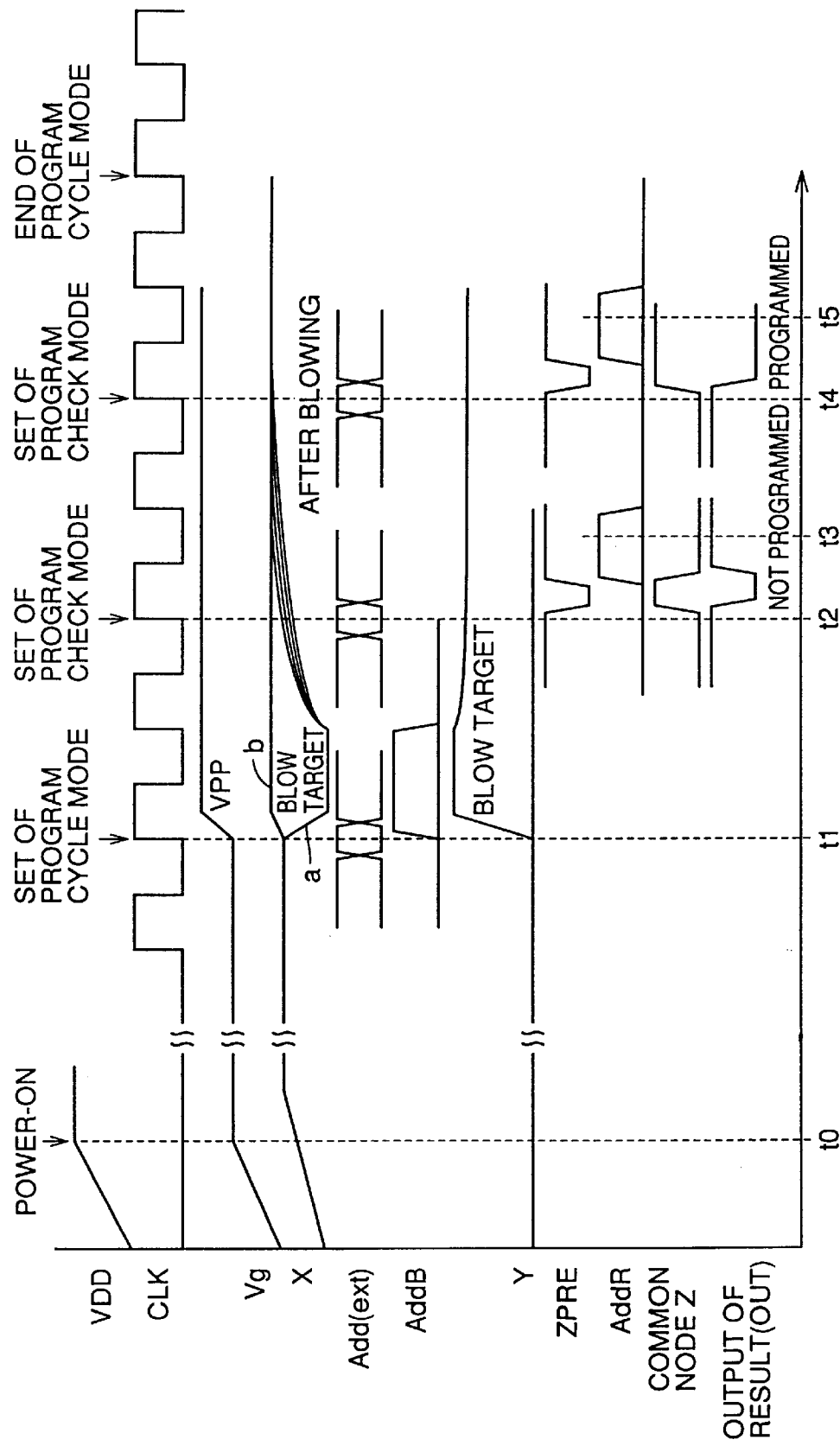
FIG. 10 is a timing chart in the case where program circuit 20 shown in FIG. 9 is used in a redundancy determining circuit 220 shown in FIG. 8.
Figure 11:
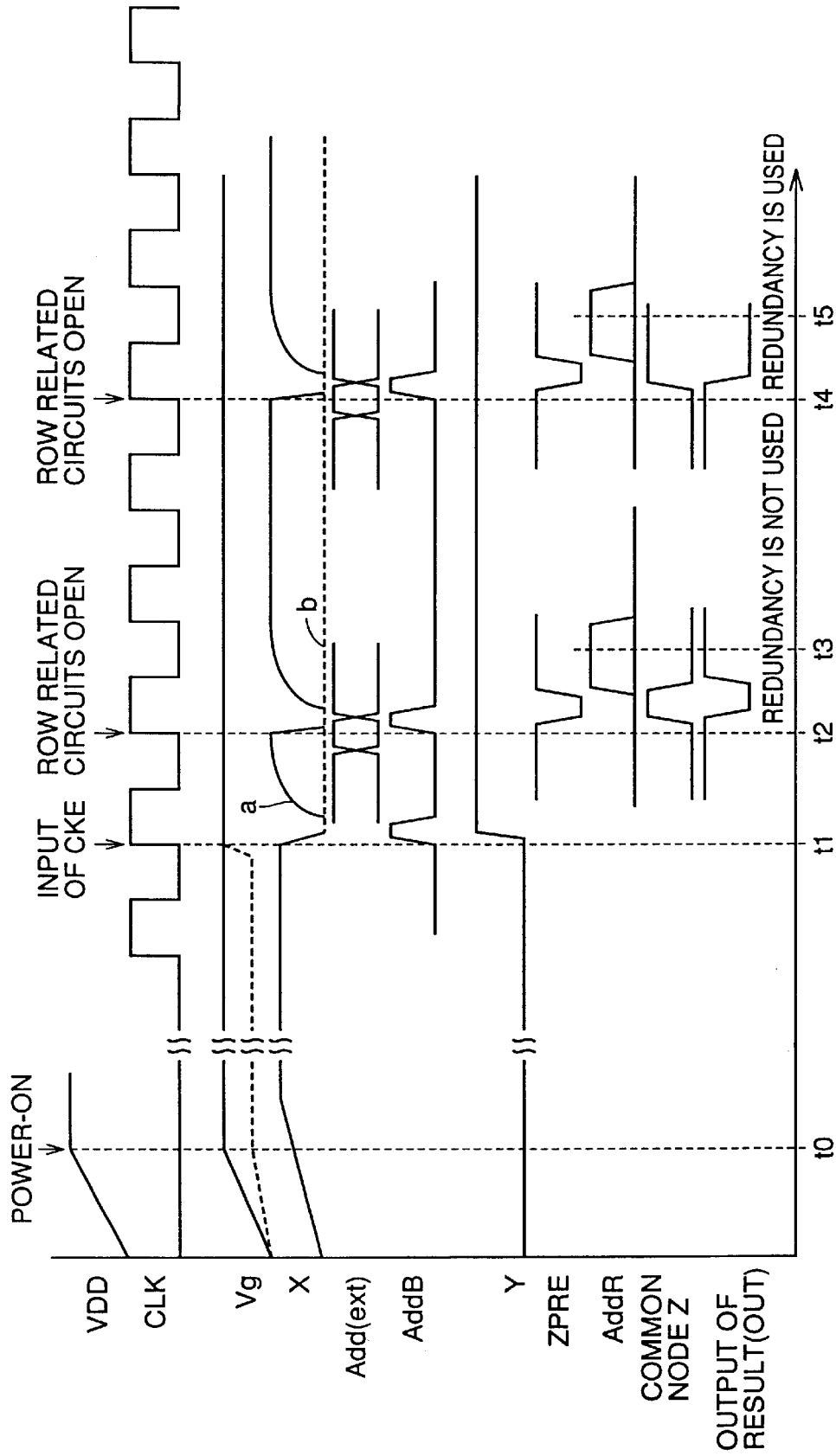
FIG. 11 is a timing chart in the case where program circuit 20 shown in FIG. 9 is used in the redundancy determining circuit 220 shown in FIG. 8.

FIG. 10 shows the operation in the address program mode, and FIG. 11 shows the operation in the read mode. In each mode, external clock signal CLK controlling the operation of the semiconductor integrated circuit device is supplied after power-on.

The control and operation in the address program mode will be described below with reference to FIG. 10. At time t0, power (VDD) is supplied. Program power supply potential Vg rises to the internal power supply voltage level. Node X is gradually charged by a reverse leak current of diode 26.

External clock signal CLK is supplied. When the level of external clock signal CLK rises at time t1, the program cycle mode is set. Program power supply potential Vg is set to high voltage VPP.

External address Add(ext) is taken in. The potential on node X corresponding to program address Add B is initialized (i.e., set to ground potential GND).

Thereby, PMOS transistor P2 is turned on, and the potential on node Y corresponding to capacitor C, which is to be programmed and therefore is the program target, rises to the level of high voltage VPP.

A high voltage is applied across the opposite ends (nodes X and Y) of capacitor C to be programmed (i.e., blown). Thereby, the dielectric of capacitor C is broken. As a result, the potential on node X rises as represented by solid line a relating to node X in FIG. 10. Concurrently, program address AddB is returned to the level of ground potential GND.

During or after breakage of the capacitor, the programming state (completed or not) is checked (program check mode). For example, in response to the rising of external clock signal CLK at time t2, the program check mode is set.

An external address Add(ext) is taken in. Precharge signal ZPRE is lowered to L-level, and common node Z is charged. Output node OUT is discharged.

Comparison address AddR is supplied. If the programming is not yet completed, the potential on node X is lower than H-level. Therefore, PMOS transistor P1 and NMOS transistor N0 are turned on, and common node Z is discharged. Consequently, output node OUT is charged to H-level. At time t3, it is determined that the programming is not yet completed.

In response to the rising of external clock signal CLK at time t4, the program check mode is set again.

External address Add(ext) is taken in. Precharge signal ZPRE is lowered to L-level, and common node Z is charged. Output node OUT is discharged.

Comparison address AddR is supplied. If the capacitor C to be programmed is already broken, node X carries internal power supply potential VCC. Therefore, common node Z holds H-level because PMOS transistor P1 is off. Therefore, output node OUT maintains L-level. At time t5, the programming is completed.

With reference to FIG. 11, control and operation in the read mode will be described below. At time t0, the power (VDD) is supplied. Program power supply potential Vg is set to the internal power supply potential (or is set to the floating state). Node X is charged by the reverse leak current of diode 26.

At time t1, the antifuse address detecting circuit is initialized. More specifically, the initial setting is performed in response to external clock enable signal CKE which is supplied in accordance with rising of external clock signal CLK.

Program power supply potential Vg is set to internal power supply potential VCC. External address Add(ext) is taken in. Node X corresponding to program address AddB is initialized. Thereby, PMOS transistor P2 is turned on, and node Y carries internal power supply voltage VCC.

The potential on node X for the broken capacitor rises as represented by solid line a relating to node X in FIG. 11. The potential on node X for the unbroken capacitor remains at the ground potential as represented by broken line b related to node X in FIG. 11.

In response to rising of external clock signal CLK at time t2, the row-related circuit is opened. External address Add (ext) is taken in. Program address AddB is supplied, and thereby corresponding node X is initialized (i.e., is set to ground potential GND).

Precharge signal ZPRE at L-level is supplied. Common node Z is charged. Output node OUT is discharged. Corresponding comparison address AddR is supplied.

When redundancy is not used, the corresponding capacitor is not broken (see broken line b relating to node X in FIG. 11). In this case, common node Z is discharged. Thereby, output node OUT is charged. At time t3, it is determined that the redundancy is not used.

In response to rising of external clock signal CLK at time t4, the row-related circuits are opened. External address Add(ext) is taken in. Node X corresponding to program address AddB is initialized.

Precharge signal ZPRE at L-level is supplied. Common node Z is charged. Output node OUT is discharged. Corresponding comparison address AddR is supplied.

When using the redundancy, the corresponding capacitor is broken (see solid line a relating to node X in FIG. 11). Since the potential on node X rises, PMOS transistor P1 is turned off. Thereby, common node Z maintains H-level, and output node OUT maintains L-level. At time t5, it is determined that the redundancy is used.

The X-decoder and redundant X-decoder shown in FIG. 8 raise the potential on spare word line SWL or word line WL in response to the potential on output node OUT.

An operation for checking the initial failure in antifuse address detecting circuits 25a, . . . shown in FIG. 9 will be described below with reference to a timing chart of FIG. 12. In the initial failure check mode, the operation is performed to detect the initial failure in the program elements.

After power-on, external clock signal CLK controlling the operation of the semiconductor device is supplied. External address Add(ext) is used for selecting the program set.

Figure 12:
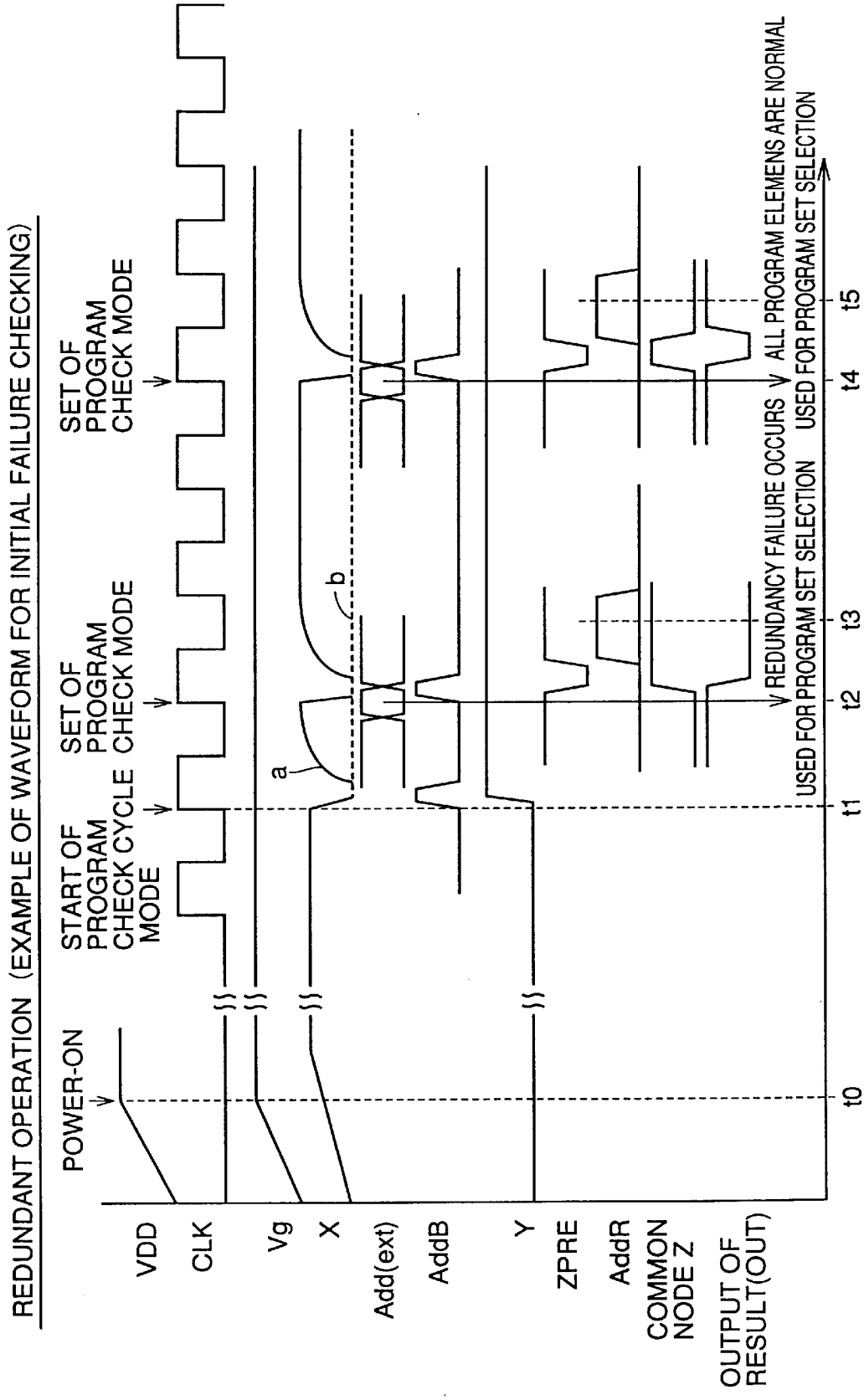
FIG. 12 is a timing chart showing an operation for checking an initial failure in the antifuse address detecting circuit in the embodiment 2 shown in FIG. 9.

Referring to FIG. 12, the power is turned on at time t0. Program power supply potential Vg is set to internal power supply potential VCC. Node X is charged by the reverse leak current of the diode.

In response to the rising of external clock signal CLK at time t1, the program check cycle mode starts. External address Add(ext) is taken in. Node X corresponding to program address AddB is initialized.

Thereby, PMOS transistor P2 is turned on, and the potential on node Y for capacitor C to be programmed is set to internal power supply potential VCC.

The potential on node X for the capacitor C having an initial failure rises (see solid line a relating to node X in FIG. 12). Node X for normal capacitor C maintains ground potential GND (solid line b relating to node X in FIG. 12).

An operation in the case where the capacitor has an initial failure will be described below. The program check mode is set in response to the rising of external clock signal CLK at time t2.

External address Add(ext) is taken in. Node X corresponding to program address AddB is initialized. Node Y is at internal power supply voltage level VCC. Node Y is at the level of internal power supply voltage VCC. Precharge signal ZPRE at L-level is supplied. Common node Z is charged. Output node OUT is discharged.

Comparison address AddR is supplied. If a failure is present in capacitor C which is not yet programmed, the potential on node X changes into internal power supply voltage VCC. Thereby, PMOS transistor P1 is turned off, and common node Z maintains H-level independently of comparison address AddR. Consequently, the potential on output node OUT holds L-level. It is determined that the initial failure (redundancy failure) is present at time t3.

Description will now be given on the case where the capacitor is normal. The program check mode is set in response to the rising of external clock signal CLK at time t4.

External address Add(ext) is taken in. Node X related to program address AddB is initialized. Node Y is at internal power supply voltage level VCC. Precharge signal ZPRE at L-level is supplied. Common node Z is charged. Output node OUT is discharged.

Comparison address AddR is supplied. If capacitor C is normal and thus is not broken, node X maintains ground potential GND. Therefore, PMOS transistor P1 and NMOS transistor N0 are turned on. Common node Z is discharged. Thereby, output node OUT is charged. It is determined that all the antifuses are normal at time t5.

The structure for removing a defective program element will be described below with reference to FIGS. 13 and 14. The structure shown in FIG. 13 is arranged in redundancy determining circuit 220 shown in FIG. 8.

Figure 13:
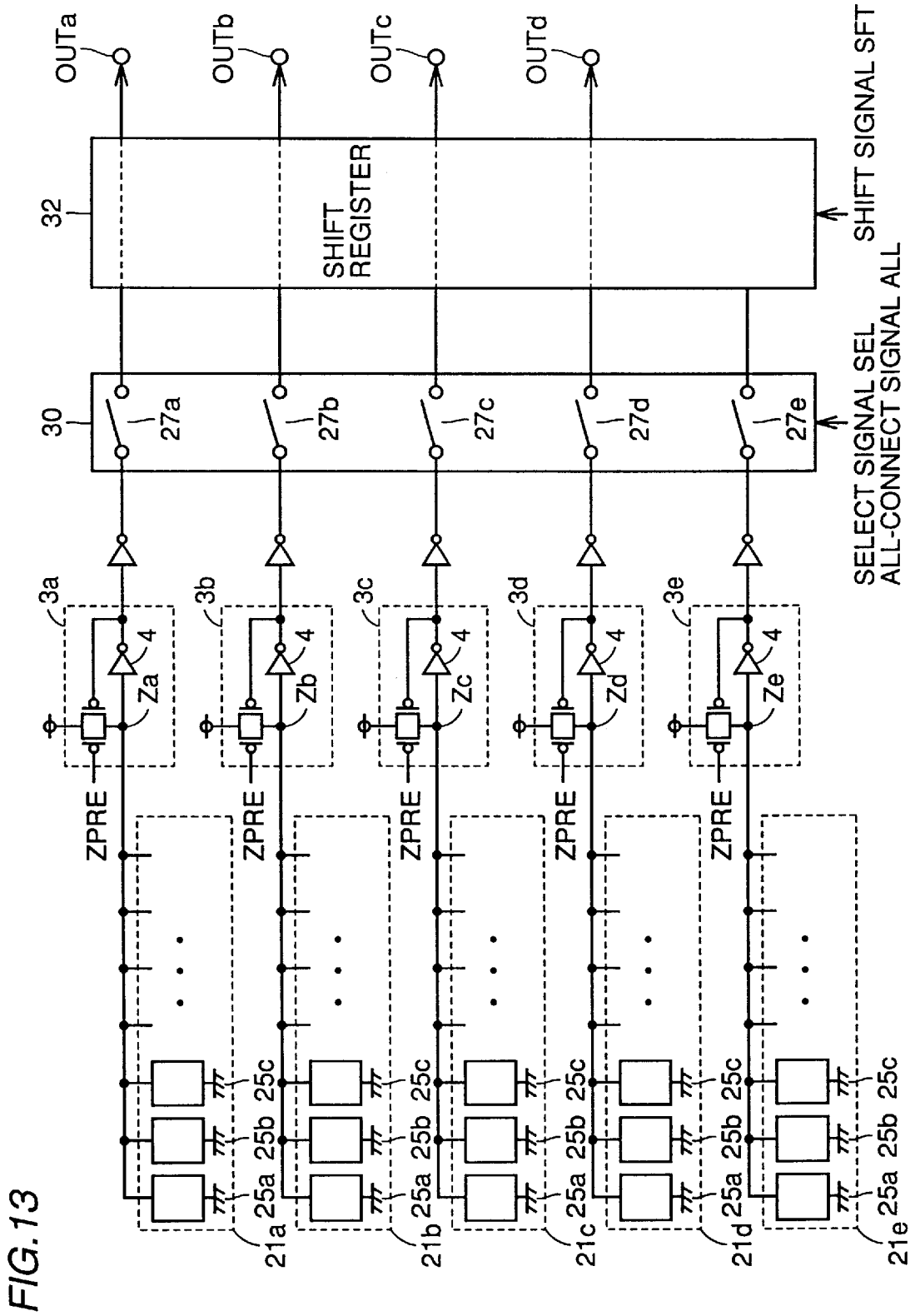
FIG. 13 shows a circuit structure for removing an initial failure in a program element.

The structure shown in FIG. 13 is provided with five program units 21a, 21b, 21c, 21d and 21e.

Each of program units 21a–21e corresponds to program unit 25 shown in FIG. 9, and includes, e.g., a plurality of antifuse address detecting circuits 25a, 25b, . . . shown in FIG. 6.

Holding circuits 3a, 3b, 3c, 3d and 3e are arranged correspondingly to program units 21a–21e, respectively. Each of holding circuits 3a–3e corresponds to holding circuit 3 shown in FIG. 9.

Each of program units 21a, 21b, 21c, 21d and 21e is connected between a corresponding common node (Za, Zb, Zc, Zd or Ze in the figure) and the ground potential.

A select circuit 30 is arranged for common nodes Za, Zb, Zc, Zd and Ze. Select circuit 30 includes a plurality of switches 27a, 27b, 27c, 27d and 27e. Switches 27a–27e are arranged corresponding to program units 21a–21e, respectively.

Select circuit 30 receives a select signal SEL and an all-connect signal ALL. When all-connect signal ALL is supplied, all switches 27a–27e are turned on to transmit the outputs of respective common nodes Za–Ze to a shift register 32, which will be described later.

When select signal SEL is supplied, the corresponding switch is selected from switches 27a–27e, and is turned on. The output of the common node corresponding to the switch which is turned on is transmitted to shift register 32, which will be described later.

Register 32 receives the output of select circuit 30. Shift register 32 is responsive to a shift signal SFT to transmit the received signal to output nodes OUTa, OUTb, OUTc and OUTd from which the results of redundancy determination are sent.

In the state shown in FIG. 13, switches 27a, 27b, 27c and 27d are connected to output nodes OUTa, OUTb, OUTc and OUTd, respectively.

Figure 14:
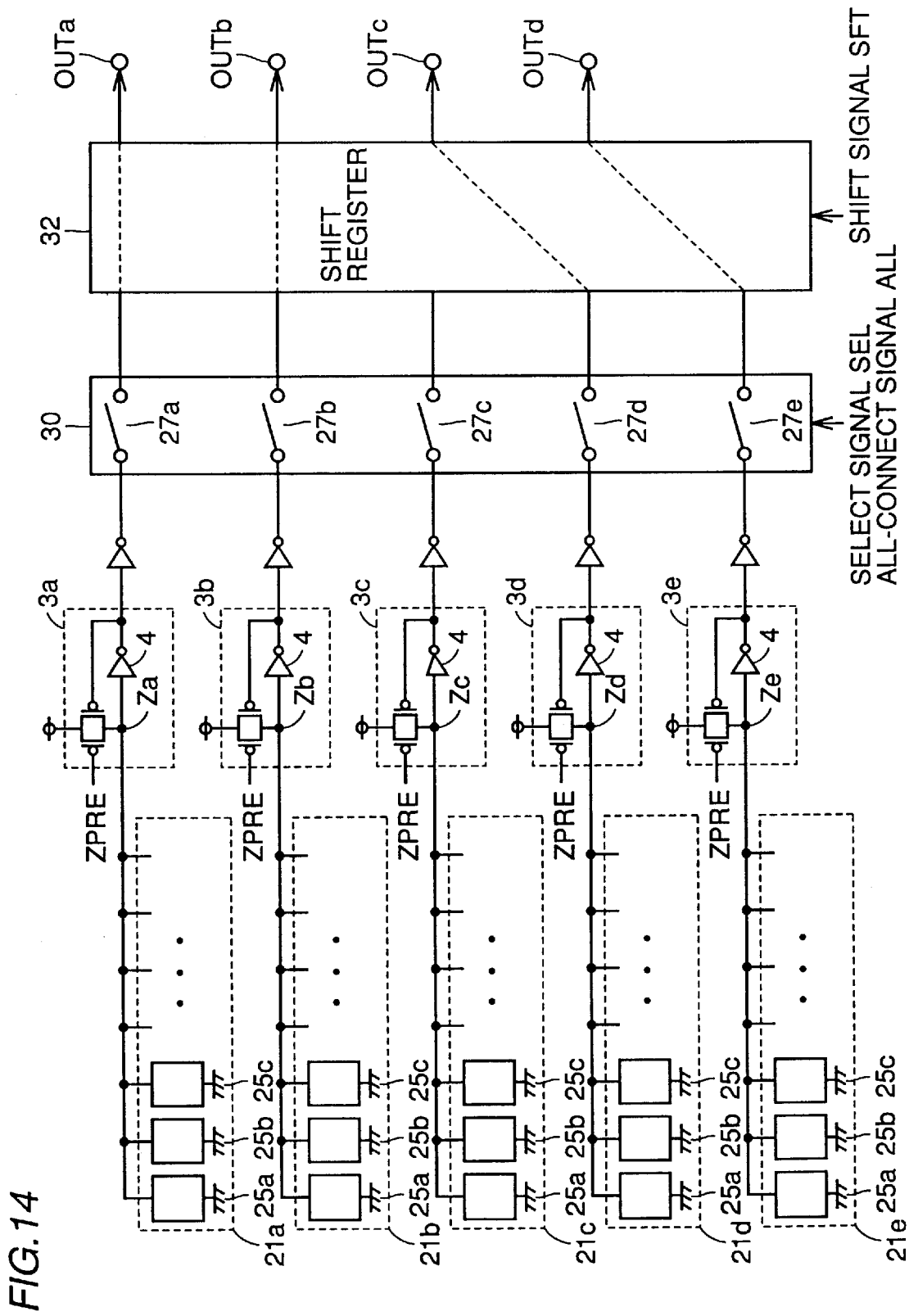
FIG. 14 shows an operation of removing an initial failure detected in the circuit structure shown in FIG. 13.

Referring to FIG. 14, description will be given on an initial failure removing operation in the case where a failure is detected in program unit 21c by the initial failure check operation.

As shown in FIG. 14, it is assumed that the failure was detected in program unit 21c during the initial failure check mode. In this case, switches 27a, 27b, 27d and 27e except for switch 27c are turned on in response to select signal SEL.

Shift register 32 uses shift signal SFT and supplies the output of switch 27d to an output node OUTc instead of switch 27c. The output of switch 27e is supplied to an output node OUTd. As a result, program unit 21e operates instead of program unit 21c.

An example of another structure of the antifuse address detecting circuit in the embodiment 2 of the invention will be described below with reference to FIG. 15.

Figure 15:
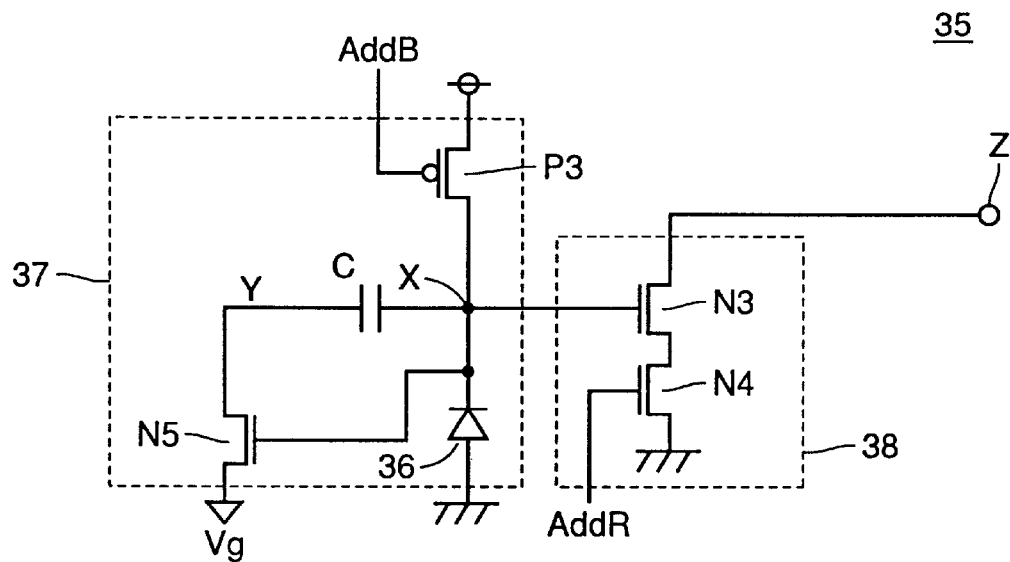
FIG. 15 is a circuit diagram showing an example of another structure of the antifuse address detecting circuit in the embodiment 3 of the invention.

Antifuse address detecting circuit 35 shown in FIG. 15 includes an antifuse program circuit 37 and an address comparing circuit 38.

Address comparing circuit 38 is connected between the ground potential and common node Z. Common node Z is connected to output node OUT through protective circuit 3 (not shown in FIG. 15).

Antifuse program circuit 37 includes an NMOS transistor N5, a PMOS transistor P3, a diode 36 and capacitor C. Diode 36 is connected between node X and the ground potential. PMOS transistor P3 is connected between node X and the power supply potential. PMOS transistor P3 receives program address AddB on its gate electrode.

Capacitor C is connected between nodes X and Y. NMOS transistor N5 is connected between node Y and program power supply potential Vg. The gate electrode of NMOS transistor N5 is connected to node X.

Address comparing circuit 38 includes NMOS transistors N3 and N4, which are connected in series between common node Z and the ground potential. NMOS transistor N4 receives comparison address AddR on its gate electrode. The gate electrode of NMOS transistor N3 is connected to node X.

According to the above structure, the potentials on nodes X and Y are adjusted to break capacitor C. After the break, application of the high potential can be stopped by feeding back the potential on node X.

Embodiment 4

An antifuse address detecting circuit 40 in an embodiment 4 of the invention will be described below with reference to FIG. 16. Antifuse address detecting circuit 40 in the embodiment 4 of the invention is used instead of each of antifuse address detecting circuits 25a, . . . shown in FIG. 9.

Figure 16:
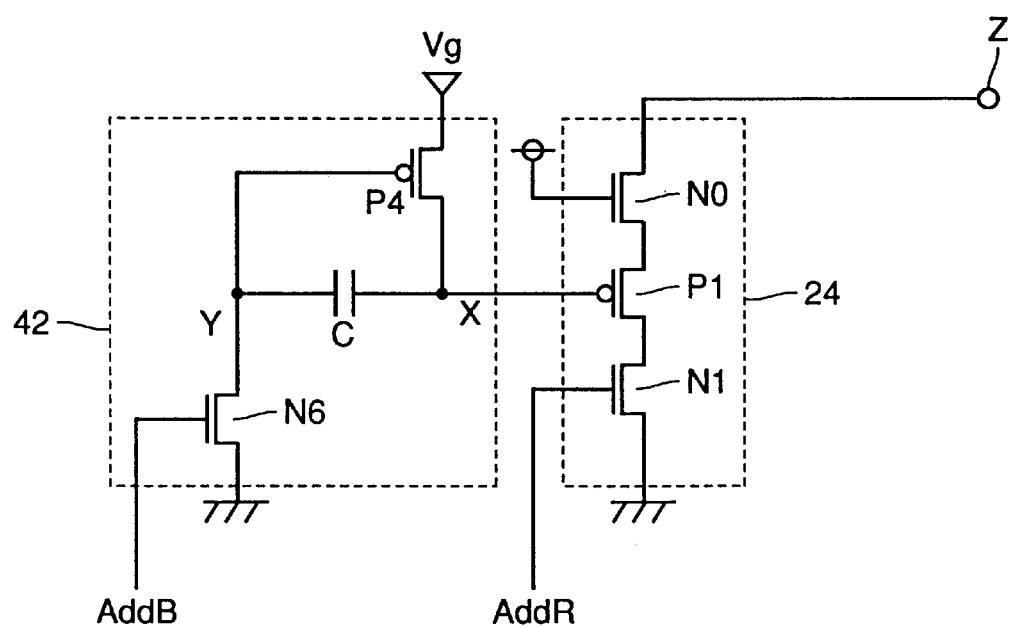
FIG. 16 is a circuit diagram showing an example of a specific structure of an antifuse address detecting circuit 40 in an embodiment 4 of the invention.

Antifuse address detecting circuit 40 shown in FIG. 16 includes an antifuse program circuit 42 and address comparing circuit 24. Address comparing circuit 24 is connected between common node Z and the ground potential as already described. The common node Z is connected to output node OUT via holding circuit 3 (not shown in FIG. 16).

Antifuse address detecting circuit 42 includes an NMOS transistor N6, a PMOS transistor P4 and capacitor C. PMOS transistor P4 is connected between node X and program power supply potential Vg.

Capacitor C is connected between nodes Y and X. The gate electrode of PMOS transistor P4 is connected to node Y. NMOS transistor N6 is connected between node Y and the ground potential. NMOS transistor N6 receives program address AddB on its gate electrode.

In the address program mode, the program address is supplied so that PMOS transistor P4 is turned on to initialize node Y. A high voltage is applied to node X. Then, program address AddB is set to an intermediate potential. The potential on node Y is raised by a leak current of NMOS transistor N6. Thereby, the dielectric of capacitor C is broken.

In the read mode, node X is set to internal power supply potential VCC. When capacitor C is broken, the quantity of current flowing through node X changes. Address comparing circuit 24 detects this change. As a result, it can be determined whether the redundancy is used or not by monitoring the potential on common node Z (potential on the output node).

Embodiment 5

An antifuse program circuit 50 in an antifuse address detecting circuit in an embodiment 5 of the invention will be described below with reference to FIG. 17.

The same components as those in conventional antifuse program circuit 900 bear the same reference numbers or characters, and will not be described below. Antifuse program circuit 50 shown in FIG. 17 differs from conventional antifuse program circuit 900 in that NAND circuit 318 is employed instead of inverter circuit 917.

One of input terminals P of NAND circuit 318 is connected to a node V. Node V is electrically connected to node VCOM based on a signal DVCE. The other input terminal Q of NAND circuit 318 is connected to an inverter circuit 319, which is connected to a switch 320.

Switch 320 includes an input node A, a node B and a node C. Input node A is selectively connected to nodes B and C.

Figure 17:
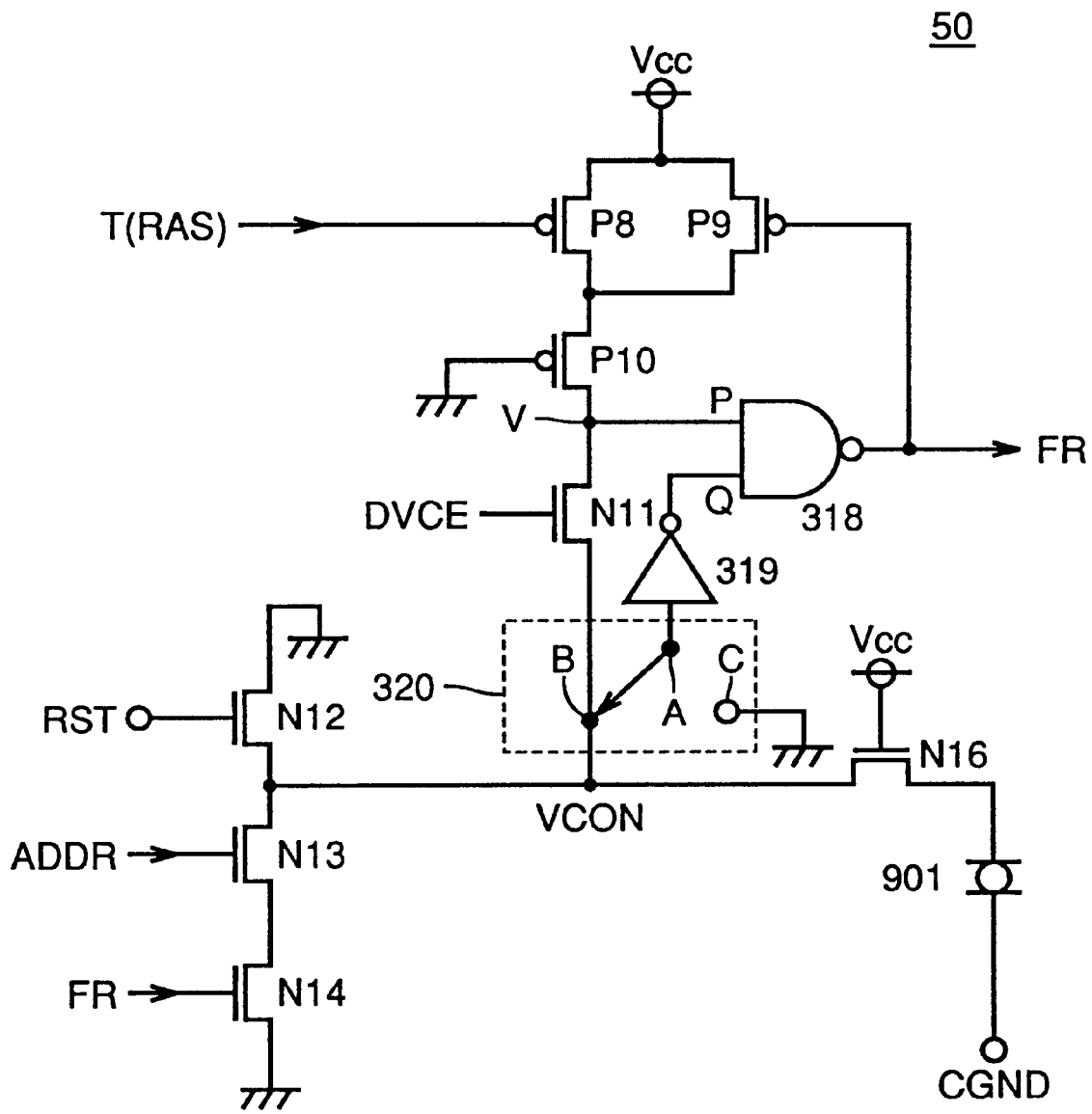
FIG. 17 is a circuit diagram showing an example of a specific structure of an antifuse program circuit 50 in an embodiment 5 of the invention.

In FIG. 17, node B is connected to node VCOM, and node C is connected to the ground potential.

Before blowing off antifuse 901, input node A is connected to node B (or power supply potential VCC). Input node A is connected to ground potential GND (node C) at the time of blowing antifuse 901.

For comparison, an operation of conventional antifuse program circuit 900 shown in FIG. 24 will be described below. In the normal operation mode, node CGND carries ground potential GND, and signal T(RAS) is at L-level. When antifuse 901 is not blown, the potential on node V is at H-level. Inverter circuit 917 issues signal FR at L-level.

When antifuse 901 is blown, antifuse 901 functions as a resistor of several kilohms so that node VCOM attains the level of ground potential GND. Since NMOS transistor N11 has a larger current drive power than PMOS transistor P10, the potential on node V is lower than the logical threshold voltage. Therefore, signal FR attains H-level. When the address comparing circuit (not shown) receiving signal FR at H-level is supplied with corresponding address signal ADDR, it is determined that a defective address is detected.

In the address program mode, signal T(RAS) at H-level is supplied so that signal RST is raised, and the potentials on nodes VCOM and V are lowered to ground potential GND. Inverter circuit 917 issues signal FR at H-level. After latching signal FR, signal RST is returned to L-level.

Then, defective address ADDR to be programmed is supplied to form a path from antifuse 901 to ground potential GND. A high voltage is applied to node CGND to blow off antifuse 901. When antifuse 901 is blown, a current flows from node CGND through node VCON and NMOS transistors N13 and N14.

In accordance with increase in current, the potential on node VCON rises, and the potential on node V rises above the logical threshold voltage of inverter circuit 917. As a result, signal FR is latched at the state at L-level. NMOS transistor N14 is turned off to interrupt a path extending to ground potential GND. Thereby, flow of an excessive current is prevented at the time of blowing.

However, antifuse 901 functions as a capacity before blowing. As a result of this capacity coupling, the potential on node VCOM may transitionally rise before antifuse 901 is blown.

Particularly, the potential on node V may rise to or above the logical threshold voltage of inverter circuit 917, in which case signal FR changes to L-level, and NMOS transistor N14 is turned off. Therefore, there is a possibility in conventional antifuse program circuit 900 that a path extending to ground potential GND is interrupted before antifuse 901 is blown off.

In view of the above, conventional antifuse program circuit 900 must prevent interruption of the current path by employing complicated control which includes two steps of applying high voltages to node CGND.

In contrast to the above, antifuse program circuit 50 in the embodiment 50 of the invention operates to connect input node A of switch 320 to node B (or power supply potential VCC) before blowing antifuse 901. As a result, the signal applied to input terminal Q can be kept at L-level by appropriately setting the logical threshold voltage of inverter circuit 319, even if the potential on node V transitionally rises due to application of a high voltage to node CGND.

Therefore, such a problem can be prevented that the signal FR changes from H-level to L-level (i.e., the latched state changes) before blowing antifuse 901. Therefore, it is possible to hold stably the path from node VCON to ground potential GND through NMOS transistors N12 and N13 without using complicated control, which is required for application of a high voltage in the prior art.

Switch 320 is controlled to connect input node A to ground potential GND (node C) at the time of blowing antifuse 901. Thereby, the potential on an input terminal Q of NAND circuit 318 changes to H-level so that a current path from node VCON to ground potential GND is interrupted, and flow of an excessively large current can be prevented.

Owing to the above structure, it is possible to prevent the interruption of the current path, which may occur due to transitional rising of voltage when blowing off the antifuse, and therefore the antifuse can be blown stably and reliably.

Embodiment 6

An antifuse program circuit of an antifuse address detecting circuit in an embodiment 6 of the invention will be described below with reference to FIG. 18.

Figure 18:
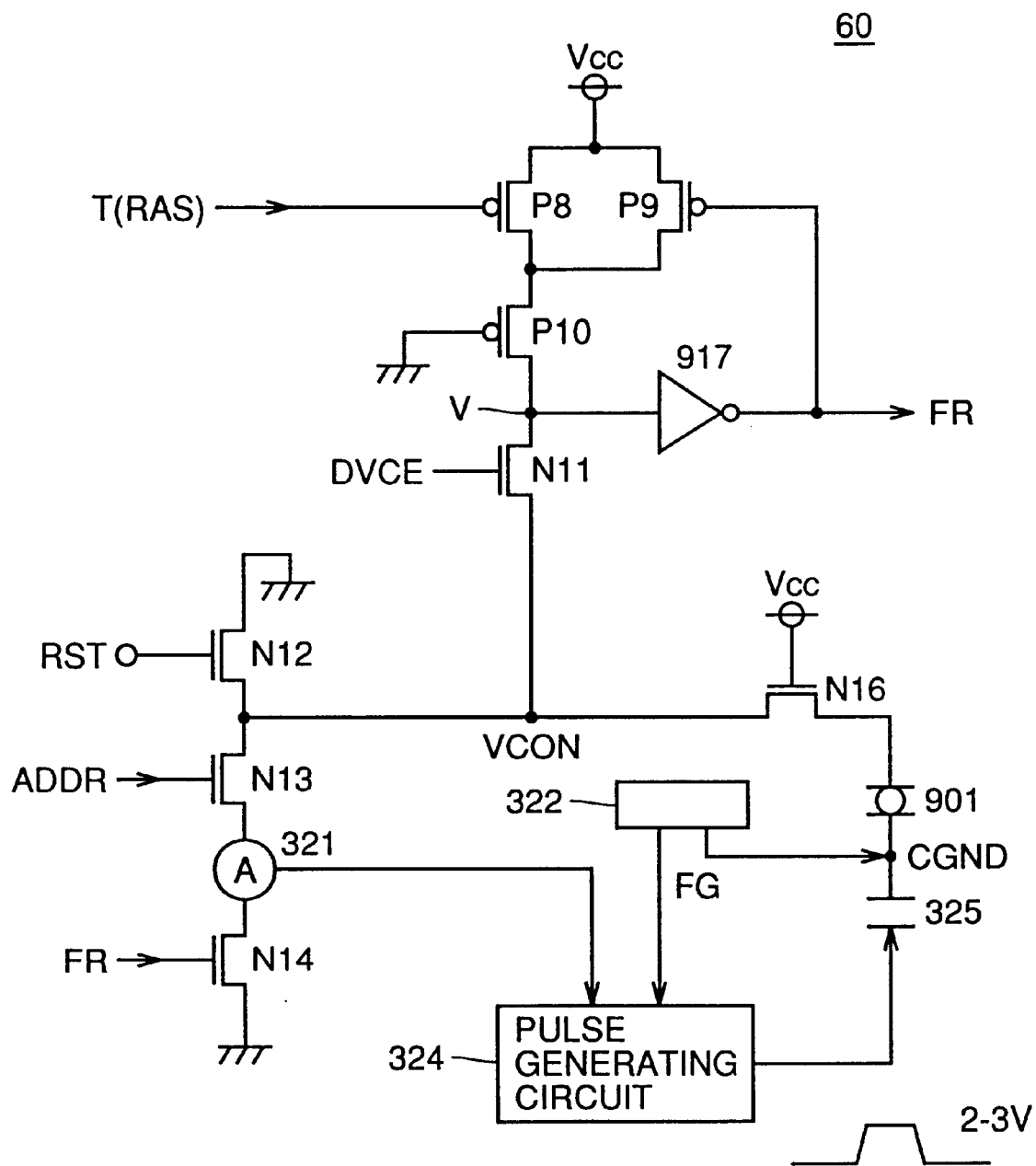
FIG. 18 is a circuit diagram showing an example of a specific structure of an antifuse program circuit 60 in an embodiment 6 of the invention.

FIG. 18 is a circuit diagram showing an example of a specific structure of antifuse program circuit 60 in the embodiment 6 of the invention. The same components as those of conventional antifuse program circuit 900 bear the same reference characters or numbers, and will not be described below.

In addition to the structure shown in FIG. 24, antifuse program circuit 60 shown in FIG. 18 further includes a current monitor 321, a control circuit 322, a pulse generating circuit 324 and a capacitor 325.

Current monitor 321 measures a current flowing from node CGND to node VCON. Control circuit 322 performs control for applying a high voltage to node CGND. Control circuit 322 issues a flag signal FG. Flag signal FG is issued at the time delayed from application of the high voltage to node CGND by a time period required for blowing off antifuse 901.

Pulse generating circuit 324 generates a voltage pulse of 2–3 V in response to the output of current monitor 321 and flag signal FG. Capacitor 325 is connected between node CGND and the output node of pulse generating circuit 324.

Figure 19:
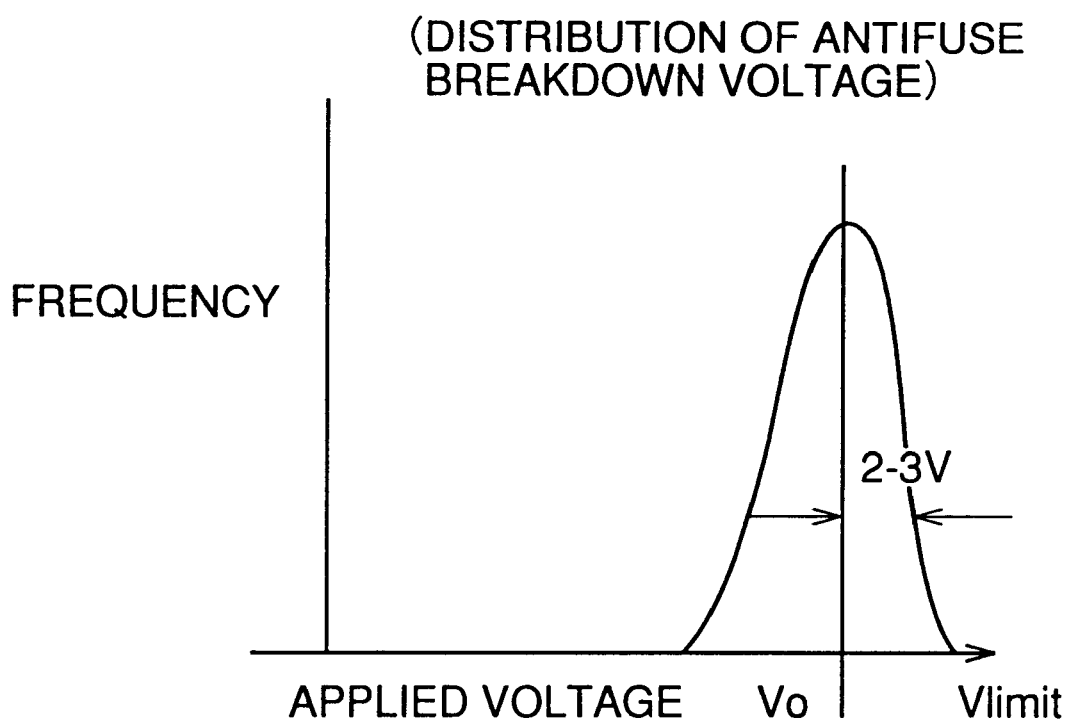
FIG. 19 shows a relationship between an antifuse 901 and an applied potential in the embodiment 6 of the invention.

With reference to FIG. 19, description will be given on conditions of voltage application in the case where a BST capacitor ((Ba, Sr) TiO3) is used as antifuse 901 of the embodiment 6 of the invention.

FIG. 19 shows a relationship between the applied potential and antifuse 901 in the embodiment 6 of the invention, and more specifically shows a distribution of breakdown voltage of a BST film in the case the BST capacitor is used as antifuse 901.

Solid line in FIG. 19 shows the distribution of the breakdown voltage of the BST film given by the ordinate with respect to the applied voltage given by the abscissa. As shown in FIG. 19, the breakdown voltage of BST film is generally distributed over a range of several volts.

In the conventional antifuse program circuit 900, therefore, it is necessary to apply an excessively high voltage larger than the maximum allowable voltage Vlimit to nodes CGND corresponding to all antifuses 901 in order to blow off antifuses 901 which are formed of insulating films having significantly different breakdown voltages, respectively.

In the embodiment 6 of the invention, however, the voltage applied to node CGND is suppressed to a voltage V0 which is a central value in the breakdown voltage distribution.

When voltage V0 is applied, a majority of antifuses 901 are blown and change into low resistance elements. However, other antifuse(s) 901 may not be blown. Accordingly, the potential on node CGND is controlled with current monitor 321 and flag signal FG.

More specifically, pulse generating circuit 324 is set ready, and the current flowing from node VCON to ground potential GND is directly measured with current monitor 321.

When the output signal of current monitor 321 indicates that the current flowing from node VCON to ground potential GND has not reached a predetermined expected current value, pulse generating circuit 324 determines that antifuse 901 is not sufficiently blown, and applies a voltage pulse of 2–3 V to capacitor 325. Thereby, the potential on node CGND further rises 2–3 V. Consequently, antifuse 901 which was not sufficiently blown can be blown.

Owing to the above structure, antifuses 901 can be stably and reliably blown off even if the insulating films forming antifuses 901 have breakdown voltages which are distributed over a wide range.

Embodiment 7

An antifuse program circuit in an antifuse address detecting circuit in an embodiment 7 of the invention will be described below with reference to FIG. 20.

Figure 20:
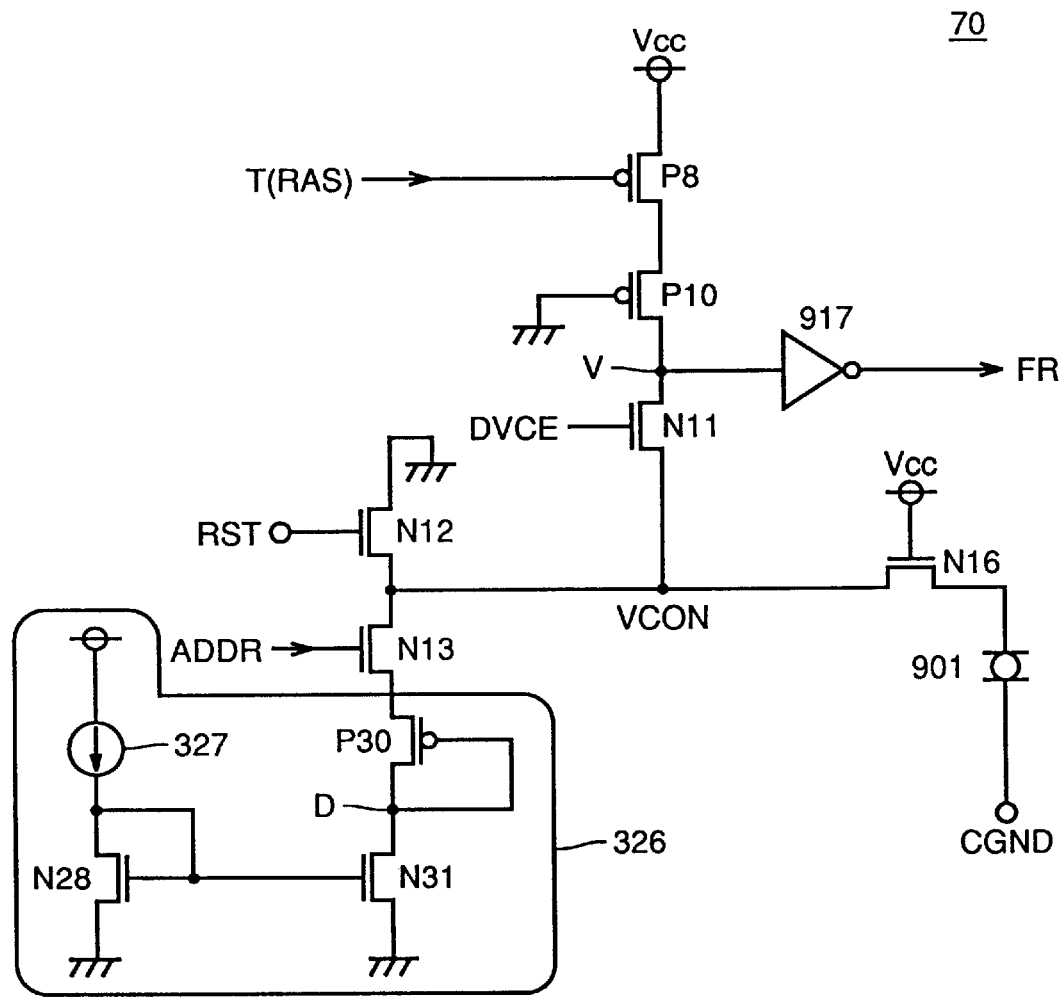
FIG. 20 is a circuit diagram showing an example of a specific structure of an antifuse program circuit 70 in an embodiment 7 of the invention.

FIG. 20 is a circuit diagram showing an example of a specific structure of an antifuse program circuit 70 in an embodiment 7 of the invention. The same components as those in conventional antifuse program circuit 900 bear the same reference characters or numbers, and will not be described below. Antifuse program circuit 70 shown in FIG. 20 differs from conventional antifuse program circuit 900 in that a current monitor 326 is employed instead of NMOS transistor N14, and PMOS transistor P9 forming the latch circuit is eliminated.

Current monitor 326 shown in FIG. 20 measures the current which flows from node CGND to node VCON when blowing off antifuse 901. Current monitor 326 includes a constant current source 327, NMOS transistors N28 and N31, and a PMOS transistor P30.

Constant current source 327 and NMOS transistor N28 are connected between the power supply potential and ground potential GND. One of the conductive terminals of PMOS transistor P30 is connected to NMOS transistor N13, and the other terminal and the gate electrode thereof are connected to node D. NMOS transistor N31 is connected between node D and the ground potential. The gate electrodes of NMOS transistors N28 and N31 are connected to the output node of constant current source 327.

When the quantity of current flowing from node VCON to ground potential GND increases during the process of blowing antifuse 901, the potential on node D rises. In this case, the current of constant current source 327 is set to an appropriate value, whereby PMOS transistor P30 starts to be turned off. When the current flowing from node VCON to ground potential GND exceeds the expected value, PMOS transistor P30 is turned off to interrupt a current path from node VCON to ground potential GND.

In conventional antifuse program circuit 900, the potential transitionally rises due to capacity coupling of antifuse 901 before blowing, whereby the latched state changes, and thereby the current path may be interrupted.

In the structure of the embodiment 7 of the invention, on/off of PMOS transistor P30 is controlled by the quantity of current flowing through the current path so that interruption of the current path, which may be caused by change in latched state, does not occur. Further, the above structure does not require the latch circuit itself.

Such a structure may be employed that one constant current source 927 and one NMOS transistor N28 are commonly used by a plurality of antifuse program circuits. If this structure is applied to redundancy determining circuit 220 in semiconductor integrated circuit device 1000 shown in FIG. 8, the layout area can be reduced.

Embodiment 8

An antifuse program circuit in an antifuse address detecting circuit in an embodiment 8 of the invention will be described below with reference to FIG. 21.

Figure 21:
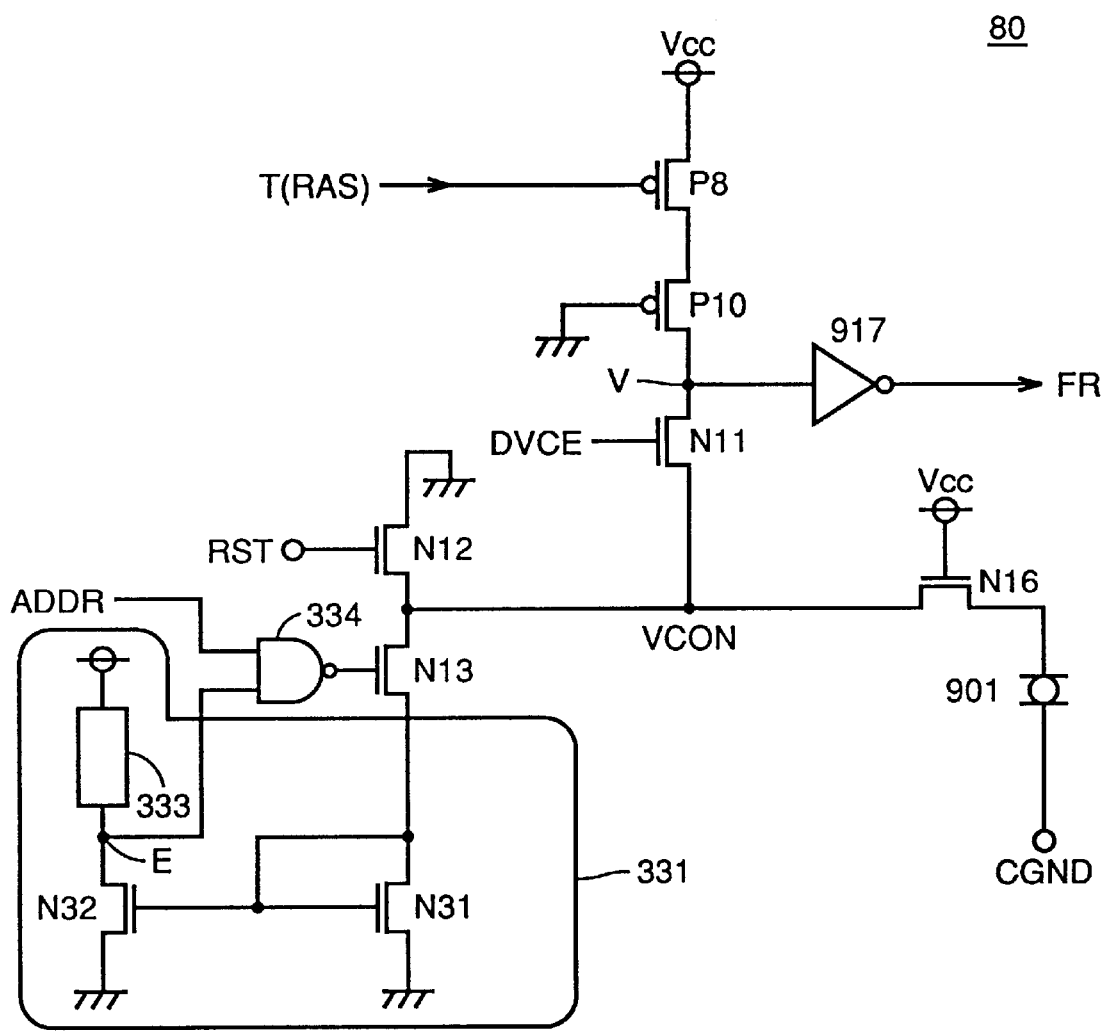
FIG. 21 is a circuit diagram showing an example of a specific structure of an antifuse program circuit 80 in an embodiment 8 of the invention.

FIG. 21 is a circuit diagram showing an example of a specific structure of an antifuse program circuit 80 in an embodiment 8 of the invention. The same components as those of antifuse program circuit 70 shown in FIG. 20 bear the same reference numbers or characters, and will not be described below.

Antifuse program circuit 80 shown in FIG. 21 differs from antifuse program circuit 70 shown in FIG. 20 in that a current monitor 331 is employed instead of current monitor 326, and NMOS transistor N13 receives the output signal of NAND circuit 334 instead of address signal ADDR.

NAND circuit 334 receives address signal ADDR on one of its input nodes, and also receives on the other input node a signal sent from current monitor 331 which will be described below.

Current monitor 331 includes a load circuit 333 as well as NMOS transistors N32 and N31. Load circuit 333 is connected between the power supply potential and a node E. NMOS transistor N32 is connected between node E and ground potential GND. Node E is connected to the input node of NAND circuit 334.

One of the conductive terminals and the gate electrode of NMOS transistor N31 are connected to NMOS transistor N13, and the other conductive terminal is connected to the ground potential. The gate electrode of NMOS transistor N32 is connected to the gate electrode of NMOS transistor N31.

When the quantity of current flowing from node VCON to ground potential GND increases during a process of blowing antifuse 901, the potential on node E lowers. When the quantity of current flowing from node VCON to ground potential GND exceeds an expected value after antifuse 901 was blown, load circuit 333 is appropriately set so that the potential on node E becomes equal to or smaller than the logical threshold voltage of NAND circuit 334.

As a result, when the quantity of current flowing from node VCON to ground potential GND exceeds the expected value, the current path from node VCON to ground potential GND is interrupted. As a result, flow of an excessively large current can be prevented.

In the structure of the embodiment 8 of the invention, on/off of NMOS transistor N13 is controlled by the quantity of current flowing through the current path so that interruption of the current path due to change in latched state does not occur. Further, the above structure does not require the latch circuit itself.

Embodiment 9

An antifuse program circuit in an antifuse address detecting circuit in an embodiment 9 of the invention will be described below with reference to FIG. 22.

Figure 22:
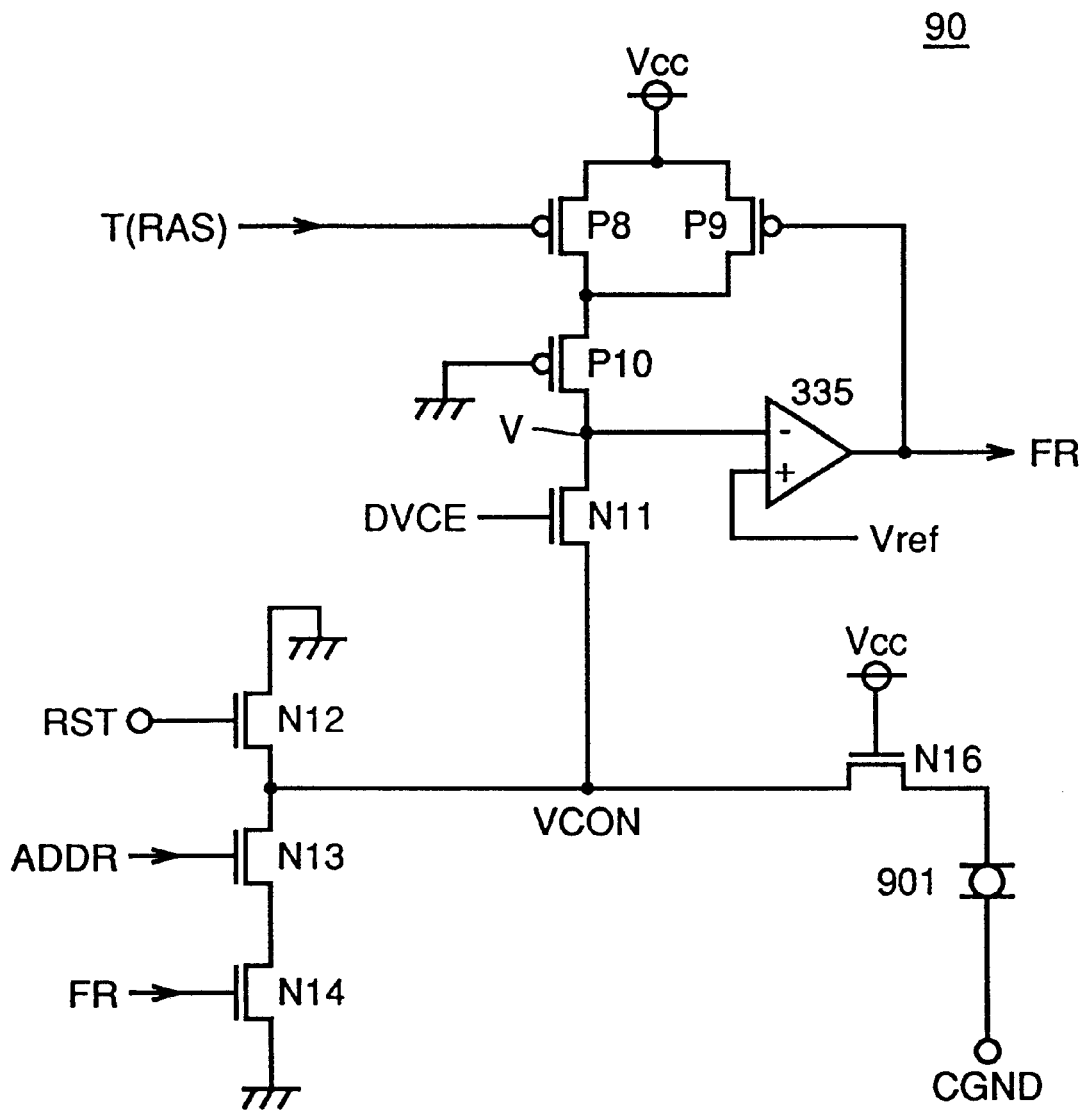
FIG. 22 is a circuit diagram showing an example of a specific structure of an antifuse program circuit 90 in an embodiment 9 of the invention.
Figure 23:
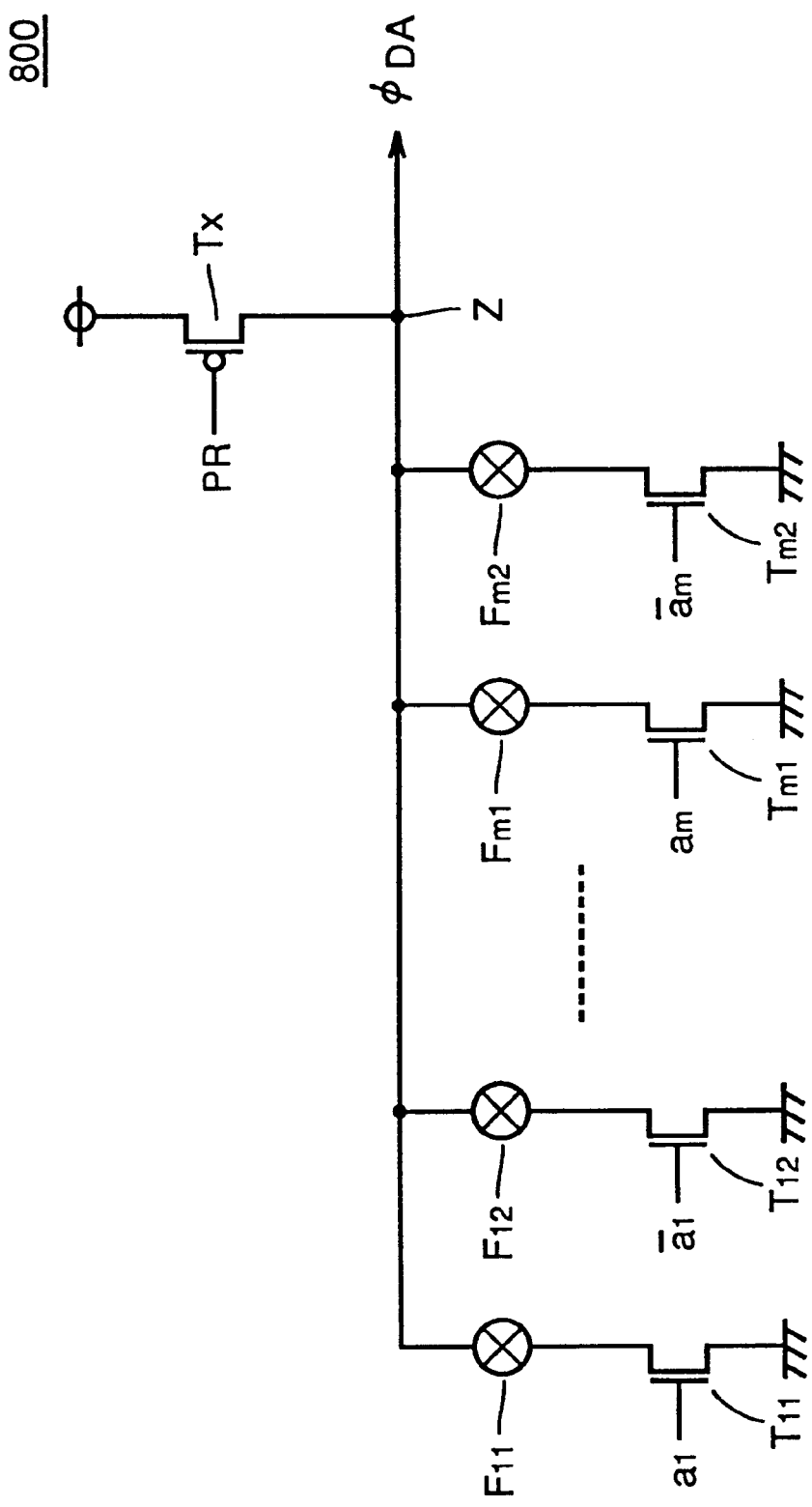
FIG. 23 is a circuit diagram showing an example of a structure of a conventional fuse-bank address detecting circuit 800 disclosed in the reference 1.

FIG. 22 is a circuit diagram showing an example of a specific structure of an antifuse program circuit 90 in the embodiment 9 of the invention. The same components as those of conventional antifuse program circuit 900 bear the same reference numbers or characters, and will not be described below. Antifuse program circuit 90 shown in FIG. 22 differs from conventional antifuse program circuit 900 in that a comparator 335 is employed instead of inverter circuit 917.

Comparator 335 compares the voltage on node V with a reference potential Vref. Comparator 335 issues signal FR. PMOS transistor P9 receives signal FR on its gate electrode.

In conventional antifuse program circuit 900, the potential on node V may not become equal to or lower than the threshold voltage of inverter circuit 917 during address detection if the resistance value does not sufficiently lower after antifuse 901 is blown.

In the structure shown in FIG. 22, comparator 335 compares the potential on node V with appropriate reference potential Vref, whereby it is possible to suppress an influence which may be caused by possible variations in resistance value of blown antifuses 901, and thereby appropriate signal FR can be produced.

Thereby, a normal operation is ensured even if the antifuses are not blown sufficiently so that redundancy determining circuit 220 of semiconductor integrated circuit 1000 shown in FIG. 8 can perform the normal operation by employing the foregoing embodiment, even if there are variations in blown state.

Reference potential Vref is externally applied, or is internally generated. In the above manner, the channel resistance of PMOS transistor P10 can be reduced so that the transistor size can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An antifuse address detecting circuit comprising:
   an antifuse having a capacity type structure, and changing into a low-resistance element when said capacity type structure is blown by application of a high voltage;
   a first node connected to one of first and second terminals of said antifuse;
   a second node connected to the other terminal of said antifuse;
   first supply means for supplying the high voltage required for blowing said antifuse to said first node in a program mode for blowing said antifuse;
   second supply means for supplying a voltage to said second node; and
   a control circuit for controlling supply of the voltage from said first supply means to said first node in response to the voltage on said second node; wherein
      said second supply means supplies a first voltage to said second node at the time of start of said program mode, and supplies a voltage higher than said first voltage to said second node after the start of said program mode, and
      said control circuit includes a transistor being turned on in response to said first voltage on said second node, and being turned off when said second node carries a voltage exceeding a predetermined voltage.

2. The antifuse address detecting circuit according to claim 1, further comprising:
   a common node; and
   detecting means responsive to a comparison address signal applied thereto for determining whether said antifuse is blown or not, and charging/discharging said common node based on a result of the determination.

3. The antifuse address detecting circuit according to claim 2, further comprising:
   test means for inspecting a state of blowing of said antifuse in said program mode, wherein
      said second supply means is controlled by said test means to supply said first voltage to said second node at the time of start of a program check mode for inspecting the state of blowing of said antifuse, and supply a voltage higher than said first voltage after the start of said program check mode, and
      said detecting means receives from the test means the comparison address signal.

4. The antifuse address detecting circuit according to claim 2, further comprising:
   initial failure test means for inspecting an initial failure of said antifuse, wherein
      said second supply means is controlled by said initial failure test means to supply said first voltage to said second node at the time of start of an initial failure check mode for inspecting the initial failure of said antifuse, and supply a voltage higher than said first voltage after the start of said initial failure check mode, and
      said detecting means receives from said initial failure test means the comparison address signal.

5. A semiconductor integrated circuit device comprising:
   a plurality of memory cells;
   a plurality of redundant cells to be used as'substitutes for defective memory cells among said plurality of memory cells;
   a plurality of antifuse address detecting means being programmable with a program address corresponding to said defective memory cell in a program mode, and issuing a result of determination to a common node, in a read mode, by determining whether said redundant cell is used or not in response to an applied comparison address,
   each of said plurality of antifuse address detecting means including:
      an antifuse having a capacity type structure and being changed into a low resistance element when said capacity type structure is blown by application of a high voltage,
      a first node connected to one of first and second terminals of said antifuse,
      a second node connected to the other terminal of said antifuse,
      first supply means for applying the high voltage required for blowing said antifuse to said first node in said program mode,
      second supply means for supplying a voltage to said second node,
      control means for controlling supply of the voltage from said first supply means to said first node in response to the voltage on said second node,
      detecting means for determining a state of blowing of the corresponding antifuse in response to the comparison address, and charging/discharging said common node based on a result of the determination in said read mode; and select means being responsive to a signal on said common node for selecting the corresponding memory cell or the corresponding redundant cell.

6. The semiconductor integrated circuit device according to claim 5, wherein
said second supply means supplies, in response to the program address, a first voltage to said second node at the time of start of said program mode, and supplies a voltage higher than said first voltage to said second node after the start of said program mode, and
said control means includes a transistor being turned on in response to said first voltage on said second node, and being turned off when said second node carries a voltage exceeding a predetermined voltage.

7. The semiconductor integrated circuit device according to claim 6, further comprising:
test means for inspecting a state of blowing of said antifuse in said program mode.

8. The semiconductor integrated circuit device according to claim 6, further comprising:
input protective means arranged for each of said antifuses, wherein
said input protective means includes:
a bipolar transistor connected to a region in said antifuse carrying said high voltage,
voltage adjusting means for externally adjusting a voltage on a base region of said bipolar transistor, and
a shield layer covering said antifuse.

9. An antifuse address detecting circuit comprising:
program means for being programmed by application of a high voltage in response to a supplied program address, and determining a program state with respect to a supplied comparison address for outputting a result, including an antifuse having a capacity type structure and being changed into a low resistance element when said capacity type structure is blown by application of said high voltage; and
a shield layer shielding said antifuse.

10. The antifuse address detecting circuit according to claim 9, wherein said program means further includes:
a bipolar transistor arranged to control a current path in a region of said antifuse carrying said high voltage, and
adjusting means for adjusting a voltage on a base region of said bipolar transistor in accordance with an externally supplied signal.

11. The antifuse address detecting circuit according to claim 10, wherein
said antifuse includes two electrodes; and
a collector of said bipolar transistor is connected to one of said two electrodes.

12. The antifuse address detecting circuit according to claim 11, wherein said bipolar transistor is an NPN transistor.

13. The antifuse address detecting circuit according to claim 9, wherein
said antifuse includes two electrodes; and
a potential on said shield layer is substantially equal to a potential on one of said two electrodes.

14. The antifuse address detecting circuit according to claim 13, wherein said one of the two electrodes is connected to said shield layer.

15. A semiconductor integrated circuit device comprising:
a plurality of memory cells;
a plurality of redundant cells to be used as substitutes for defective memory cells among said plurality of memory cells; and
a plurality of program circuits, wherein
each of said plurality of program circuits includes
a plurality of antifuse address detecting circuits being programmable with program address corresponding to said defective memory cell in a program mode, and issuing a result of determination to a common node in a read mode by determining whether said redundant cell is used or not in response to an applied comparison address,
each of said plurality of antifuse address detecting circuits including
an antifuse having a capacity type structure and being changed into a low resistance element when said capacity type structure is blown by application of a high voltage,
a first node connected to one of first and second terminals of said antifuse,
a second node connected to the other terminal of said antifuse,
first supply means for applying the high voltage required for blowing said antifuse to said first node in said program mode,
second supply means for supplying a voltage to said second node,
control means for controlling supply of the voltage from said first supply means to said first node in response to the voltage on said second node, and
detecting means for determining a state of blowing of the corresponding antifuse in response to the comparison address, and charging/discharging said common node based on a result of the determination in said read mode;
said semiconductor integrated circuit device further comprising
select means being responsive to a signal on said common node for selecting the corresponding memory cell or the corresponding redundant cell;
initial failure test means for inspecting an initial failure of said antifuse; and
select control means for setting the program circuit having the initial failure to an unselected state based on an output of said initial failure test means.

16. An antifuse address detecting circuit comprising:
program means for being programmed by application of a high voltage in response to a supplied program address, and determining a program state with respect to a supplied comparison address for outputting a result, including an antifuse having a capacity type structure and being changed into a low resistance element when said capacity type structure is blown by application of said high voltage; and
a guard ring shielding said antifuse.

17. An antifuse address detecting circuit comprising:
program means for being programmed by application of a high voltage in response to a supplied program address, and determining a program state with respect to a supplied comparison address for outputting a result, including an antifuse having a capacity type structure and being, changed into a low resistance element when said capacity type structure is blown by application of said high voltage;
wherein said program means further includes:
a structure formed by second conductivity type layers sandwiching a first conductivity type layer formed in a semiconductor substrate and having a possibility of causing a bipolar operation arranged to control a current path in a region of said antifuse carrying said high voltage, and adjusting means for adjusting a voltage on a base region of said structure formed by second conductivity type layers sandwiching a first conductivity type layer formed in a semiconductor substrate and having a possibility of causing a bipolar operation in accordance with an externally supplied signal.

18. The antifuse address detecting circuit according to claim 17, wherein said antifuse includes two electrodes; and a collector of said bipolar transistor is connected to one of said two electrodes.

19. A program circuit comprising:

an electrically programmable circuit to be programmed in response to a first signal, and a logical operation circuit performing a logical operation of an output of said electrically programmable circuit and a second signal, said first and second signals having the same polarity.

20. The program circuit according to claim 19, wherein said electrically programmable circuit has a program element having a capacitive structure and is to be programmed when said first signal is applied so that an electric field is applied across both terminals of said capacitive structure, and said electric field is greater than an electric field applied across said both terminals of said capacitive structure when said program element is not being programmed.

21. The program circuit according to claim 19, wherein said electrically programmable circuit is programmed with a substitute address based on said first signal, and said program circuit converts an input address into another address based on said programmed substitute address.

22. An electrically programmable circuit comprising:

a program element having a capacitive structure and is to be programmed when said capacitive structure is destroyed by application of an electric field across both terminals of said capacitive structure, and a switch element applying said electric field across said both terminals of said capacitive structure when said program element is to be programmed, said switch element being caused to have an increased impedance after said program element is programmed so that said electric field applied across said both terminals of said capacitive structure is reduced.

23. A program circuit device comprising:

a plurality of program units, each of said program units having a plurality of program circuits, each of said program circuits having an electrically programmable circuit, a number of said program units being smaller than a number of output nodes of said program circuit device, and a select circuit provided between said plurality of program units and said output nodes and selectively connecting outputs of said program units and said output nodes.

24. The program circuit device according to claim 23, wherein said select circuit connects said outputs of said program units of the same number as the number of said output nodes to said output nodes.

25. The program circuit device according to claim 23, wherein each of said program units is programmed with a redundant address of a semiconductor memory.

\* \* \* \* \*